(12) United States Patent
Lu et al.

(10) Patent No.: US 10,826,534 B2
(45) Date of Patent: Nov. 3, 2020

(54) ENCODING METHOD, ENCODER, AND DECODER FOR DYNAMIC POWER CONSUMPTION CONTROL

(71) Applicant: HUAWEI TECHNOLOGIES CO., LTD., Shenzhen, Guangdong (CN)

(72) Inventors: Yuchun Lu, Beijing (CN); Liang Li, Beijing (CN); Suping Zhai, Shenzhen (CN); Dajun Zang, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 15 days.

(21) Appl. No.: 16/046,618

(22) Filed: Jul. 26, 2018

(65) Prior Publication Data

US 2019/0028120 A1 Jan. 24, 2019

Related U.S. Application Data

(63) Continuation of application No. PCT/CN2016/098674, filed on Sep. 12, 2016.

(30) Foreign Application Priority Data

Jan. 28, 2016 (CN) .......................... 2016 1 0061638

(51) Int. Cl.
*H03M 13/15* (2006.01)
*H04L 1/00* (2006.01)
*H03M 13/00* (2006.01)

(52) U.S. Cl.
CPC ..... *H03M 13/1545* (2013.01); *H03M 13/157* (2013.01); *H03M 13/158* (2013.01);
(Continued)

(58) Field of Classification Search
CPC ............ H03M 13/157; H03M 13/158; H03M 13/1515; H03M 13/1545; H03M 13/1585; H04L 1/0041; H04L 1/0057; H04L 1/0064
See application file for complete search history.

(56) References Cited

U.S. PATENT DOCUMENTS

2005/0149821 A1 7/2005 Lee et al.
2012/0137152 A1 5/2012 Dror et al.

FOREIGN PATENT DOCUMENTS

CN 101079640 A 11/2007
CN 101478314 A 7/2009
(Continued)

OTHER PUBLICATIONS

Tan et al., A reconfigurable multi-mode architecture for Reed-Solomon Codec, IEEE, pp. 1 to 7 (Year: 2010).*
(Continued)

*Primary Examiner* — Shelly A Chase
(74) *Attorney, Agent, or Firm* — Fish & Richardson P.C.

(57) ABSTRACT

An encoding method, an encoder, and a decoder for dynamic power consumption control are provided. The encoder includes a control unit, an initial encoding unit, and L incremental encoding units. The control unit is configured to enable only the initial encoding unit in an RS ($N_0$, K) operating mode to perform encoding or enable only the initial encoding unit and first j incremental encoding units in the L incremental encoding units in an RS ($N_j$, K) operating mode to perform encoding. The initial encoding unit is configured to perform RS FEC encoding on m(x) to obtain a quotient $D_0(x)$ and a remainder $R_0(x)$ of $x^{N_0-K}m(x)$ relative to $g_0(x)$. An $(h+1)^{th}$ incremental encoding unit is configured to obtain, according to a quotient $D_h(x)$ and a
(Continued)

remainder $R_h(x)$, a quotient $D_{h+1}(x)$ and a remainder $R_{h+1}(x)$ of $x^{N_{h+1}-K}m(x)$ relative to $g_{h+1}(x)$.

8 Claims, 10 Drawing Sheets

(52) U.S. Cl.
CPC ... *H03M 13/1515* (2013.01); *H03M 13/1525* (2013.01); *H03M 13/1585* (2013.01); *H03M 13/6516* (2013.01); *H04L 1/00* (2013.01); *H04L 1/0041* (2013.01); *H04L 1/0053* (2013.01); *H04L 1/0057* (2013.01)

(56) References Cited

FOREIGN PATENT DOCUMENTS

| CN | 101692612 A | 4/2010 |
|---|---|---|
| CN | 101834616 A | 9/2010 |
| CN | 101964664 A | 2/2011 |
| CN | 102832952 A | 12/2012 |
| CN | 103929265 A | 7/2014 |

OTHER PUBLICATIONS

Yu et al., Two-mode Reed Solomon Decoder using a simplified step-by-step algorithm, IEEE, Trans on Circuits and systems II, vol. 62, No. 11, pp. 1093 to 1097 (Year: 2015).*
Wang et al., A very low cost multi mode Reed Solomon decoder based on Peterson Gorenstein Zierler algorithm, IEEE, pp. 37 to 48. (Year: 2001).*
D.V. Sarwate et al, High-speed architectures for Reed-Solomon decoders. IEEE Transactions on Very Large Scale Integration (VLSI) Systems ( vol. 9, Issue: 5, Oct. 2001 ), 15 pages.
ITU-T G.709/Y.1331 Amendment 4, Series G: Transmission Systems and Media, Digital Systems and Networks Digital terminal equipment—General Series Y: Global Information Infrastructure, Internet Protocol Aspects and Next-Generation Networks Internet protocol aspects—Transport Interfaces for the optical transport network (OTN) Amendment 4, Jan. 2015, 14 pages.
ITU-T G.709/Y.1331 Corrigendum 2, Series G: Transmission Systems and Media, Digital Systems and Networks Digital terminal equipments—General Series Y: Global Information Infrastructure, Internet Protocol Aspects and Next-Generation Networks Internet protocol aspects—Transport, Interfaces for the optical transport network Corrigendum 2, Jan. 2015, 8 pages.
ITU-T G.709/Y.1331 Amendment 3, Series G: Transmission Systems and Media, Digital Systems and Networks Digital terminal equipments—General Series Y: Global Information Infrastructure, Internet Protocol Aspects and Next-Generation Networks Internet protocol aspects—Transport, Interfaces for the optical transport network Amendment 3, Dec. 2014, 10 pages.
Subject: Erratum 1(Jan. 2014) to Recommendation ITU-T G.709/Y.1331 (2014), Interfaces for the optical transport network, Geneva, Jan. 29, 2014, 1 page.
ITU-T G.709/Y.1331 Amendment 2, Series G: Transmission Systems and Media, Digital Systems and Networks Digital terminal equipments—General Series Y: Global Information Infrastructure, Internet Protocol Aspects and Next-Generation Networks Internet protocol aspects—Transport, Interfaces for the optical transport network Amendment 2. Oct. 2013, 14 pages.
"ITU-T G.709/Y.1331 Series G: Transmission Systems and Media, Digital Systems and Networks Digital terminal equipments—GeneralSeries Y: Global Information Infrastructure, Internet Protocol Aspects and Next-Generation Networks Internet protocol aspects—Transport Interfaces for the optical transport network, Feb. 2012, 238 pages".
ITU-T G.709/Y.1331 Corrigendum 1, Series G: Transmission Systems and Media, Digital Systems and Networks Digital terminal equipments—General Series Y: Global Information Infrastructure, Internet Protocol Aspects and Next-Generation Networks Internet protocol aspects—Transport Interfaces for the Optical Transport Network (OTN) Corrigendum 1, Oct. 2012, 7 pages.
ITU-T G.709/Y.1331 Amendment 1, Series G: Transmission Systems and Media, Digital Systems and Networks Digital terminal equipments—General Series Y: Global Information Infrastructure, Internet Protocol Aspects and Next-Generation Networks Internet protocol aspects—Transport Interfaces for the Optical Transport Network (OTN) Amendment 1, Oct. 2012, 20 pages.
IEEE Std 802.3bj™-2014, IEEE Standard for Ethernet Amendment 2: Physical Layer Specifications and Management Parameters for 100 Gb/s Operation Over Backplanes and Copper Cables. 368 pages.
IEEE P802.3bs™/D1.1, Nov. 27, 2015 IEEE P802.3bs™/D1.1 Draft Standard for Ethernet☐ Amendment:☐ Media Access Control Parameters, Physical Layers and Management Parameters for 400 Gb/s Operation. 265 pages.
Mike Peng Li et al, CEI-56G-VSR-PAM4 Very Short Reach Interface. oif2015.218.02, May 8, 2015, 30 pages.
International Search Report issued in International Application No. PCT/CN2016/098674 dated Nov. 29, 2018, 23 pages.
Chinese Office Action issued in Chinese Application No. 201610061638.5 dated May 7, 2019, 3 pages.
Chinese Search Report issued in Chinese Application No. 2016100616385 dated Apr. 8, 2019, 2 pages.
Ming-Der Shieh et al: "Design and implementation of efficient Reed-Solomon decoders for multi-mode applications", 2006 IEEE International Symposium on Circuits and Systems, May 21, 2006, pp. 289-292, XP032457702.
Huai-Yi Hsu et al: "VLSI design of a reconfigurable multi-mode Reed Solomon codec for high-speed communication systems", ASIC, 2002. Proceedings. Aug. 6, 2002, pp. 359-362, XP010602866.
Extended European Search Report issued in European Application No. 16887607.6 dated Jan. 22, 2019, 10 pages.

* cited by examiner

ENCODING METHOD, ENCODER, AND DECODER FOR DYNAMIC POWER CONSUMPTION CONTROL

CROSS-REFERENCE TO RELATED APPLICATIONS

This application is a continuation of International Application No. PCT/CN2016/098674, filed on Sep. 12, 2016, which claims priority to Chinese Patent Application No. 201610061638.5, filed on Jan. 28, 2016. The disclosures of the aforementioned applications are hereby incorporated by reference in their entireties.

TECHNICAL FIELD

Embodiments of the present invention relate to the communications field, and more specifically, to an encoding method, an encoder, and a decoder for dynamic power consumption control.

BACKGROUND

As a rate of a high-speed communications link continuously increases, various damaging effects of a channel are gradually strengthened, and this causes a signal-to-noise ratio to decrease. To improve bit error performance in the case of a low signal-to-noise ratio, a forward error correction (FEC) technology gradually becomes a mandatory technology in a process of implementing the high-speed communications link. In numerous FEC codes, because of high gains, explicit performance, easy implementation, and low resource occupation, a Reed-Solomon (RS,) FEC code is gradually widely applied. The RS FEC code has been standardized in multiple communications protocols such as ITU-T G.709, IEEE 802.3bj, and IEEE 802.3bs.

For a lot of links, quality of the links greatly varies, and a percentage of a quantity of poorest links in a total quantity of links is relatively small (generally less than 15%). However, a conventional method is to choose a strongest FEC algorithm for the small percentage of poorest links, but an RS FEC code pattern cannot be dynamically adjusted. A direct consequence of this method is that an extra error correction capability of the FEC algorithm is provided for most links, and this causes unnecessary power consumption.

SUMMARY

Embodiments of the present invention provide an encoding method, an encoder, and a decoder for dynamic power consumption control, so as to reduce power consumption caused by unnecessary encoding calculation and improve system performance of the encoder to some extent.

According to a first aspect, a multimode RS FEC encoder is provided, where the multimode RS FEC encoder has a total of (L+1) RS ($N_i$, K) operating modes, i=0, 1, ..., and L, L is an integer greater than 0, and $N_i$ represents a length of an RS FEC code word in a corresponding operating mode; and $N_i = N_0 + i \times P$, $N_0$ represents a shortest length of an RS FEC code word in the multimode RS FEC encoder, P is a positive integer, and K represents a quantity of information symbols in the RS FEC code word, where the multimode RS FEC encoder includes a control unit, an initial encoding unit, and L incremental encoding units;

the control unit is configured to control a unit and a module that need to be enabled when the multimode RS FEC encoder performs encoding, and is specifically configured to enable only the initial encoding unit in an RS ($N_0$, K) operating mode to perform encoding or enable only the initial encoding unit and first j incremental encoding units in the L incremental encoding units in an RS ($N_j$, K) operating mode to perform encoding, where j is an integer, and $1 \leq j \leq L$;

the initial encoding unit is configured to perform RS FEC encoding on an information polynomial m(x) corresponding to an information symbol of the multimode RS FEC encoder, to obtain a quotient $D_0(x)$ and a remainder $R_0(x)$ of a polynomial $x^{N_0-K} m(x)$ relative to $g_0(x)$, where $g_0(x)$ is a generator polynomial in the RS ($N_0$, K) operating mode; and an $(h+1)^{th}$ incremental encoding unit in the L incremental encoding units is configured to obtain, according to a quotient $D_h(x)$ and a remainder $R_h(x)$, a quotient $D_{h+1}(x)$ and a remainder $R_{h+1}(x)$ of a polynomial $x^{N_{h+1}-K} m(x)$ relative to $g_{h+1}(x)$, where $g_{h+1}(x)$ is a generator polynomial in an RS ($N_{h+1}$, K) operating mode, h is an integer, and $0 \leq h < L-1$.

With reference to the first aspect, in a first possible implementation, a specific implementation is: a relationship between $D_{h+1}(x)$ and $R_{h+1}(x)$ and a relationship between $D_h(x)$ and $R_h(x)$ are expressed by the following formulas:

$$R_{h+1}(x) = r_{h+1}(x) \times g_h(x) + x^P R_h(x); \text{ and}$$

$$D_{h+1}(x) = d_{h+1}(x), \text{ where}$$

$d_{h+1}(x)$ represents a quotient of $x^P D_h(x)$ relative to a generator polynomial $g_{h,h+1}(x)$, $r_{h+1}(x)$ represents a remainder of $x^P D_h(x)$ relative to the generator polynomial $g_{h,h+1}(x)$, and a relationship among generator polynomials $g_{h,h+1}(x)$, $g_h(x)$, and $g_{h+1}(x)$ is expressed by a formula $g_{h+1}(x) = g_h(x) \times g_{h,h+1}(x)$.

With reference to the first aspect or the first possible implementation of the first aspect, in a second possible implementation, a specific implementation is: a value of L is 3, a value of P is 8, a value of $N_0$ is 520, and a value of K is 514; or a value of L is 1, a value of P is 16, a value of $N_0$ is 528, and a value of K is 514.

With reference to the first aspect, the first possible implementation of the first aspect, or the second possible implementation of the first aspect, in a third possible implementation, the multimode RS FEC encoder further includes: a fill-in unit, configured to: when the multimode RS FEC encoder is in the RS ($N_j$, K) operating mode, fill a code word whose length is $N_j$ with a fixed sequence until the length reaches $N_L$, where j<L.

With reference to any one of the first aspect, or the first to the third possible implementations of the first aspect, in a fourth possible implementation, the multimode RS FEC encoder further includes a code pattern selection unit, configured to select, as a code pattern used for encoding, a code pattern fed back by a multimode RS FEC decoder on a decoder side, so that the multimode RS FEC encoder performs encoding according to the fed-back code pattern, and sends a result of the encoding to the multimode RS FEC decoder.

According to a second aspect, an encoding method used for a multimode RS FEC encoder is provided, where the multimode RS FEC encoder has a total of (L+1) RS ($N_i$, K) operating modes, i=0, 1, ..., and L, L is an integer greater than 0, and $N_i$ represents a length of an RS FEC code word in a corresponding operating mode; and $N_i = N_0 + i \times P$, $N_0$ represents a shortest length of an RS FEC code word in the multimode RS FEC encoder, P is a positive integer, and K represents a quantity of information symbols in the RS FEC code word; and when the multimode RS FEC encoder performs encoding in an RS ($N_j$, K) operating mode, and $1 \leq j \leq L$, the method includes:

performing RS FEC encoding on an information polynomial m(x) corresponding to an information symbol of the multimode RS FEC encoder, to obtain a quotient $D_0(x)$ and a remainder $R_0(x)$ of a polynomial $x^{N_0-K}m(x)$ relative to $g_0(x)$, where $g_0(x)$ is a generator polynomial in an RS ($N_0$, K) operating mode;

cyclically performing the following step for a total of j times by assigning, to h, a value from 0 to j−1, where h is an integer, and $0 \leq h \leq j-1$; and obtaining, according to a quotient $D_h(x)$ and a remainder $R_h(x)$, a quotient $D_{h+1}(x)$ and a remainder $R_{h+1}(x)$ of a polynomial $x^{N_{h+1}-K}m(x)$ relative to $g_{h+1}(x)$, where $g_{h+1}(x)$ is a generator polynomial in an RS ($N_{h+1}$, K) operating mode.

With reference to the second aspect, in a first possible implementation, a specific implementation is: a relationship between $D_{h+1}(x)$ and $R_{h+1}(x)$ and a relationship between $D_h(x)$ and $R_h(x)$ are expressed by the following formulas:

$$R_{h+1}(x) = r_{h+1}(x) \times g_h(x) + x^P R_h(x); \text{ and}$$

$$D_{h+1}(x) = d_{h+1}(x), \text{ where}$$

$d_{h+1}(x)$ represents a quotient of $x^P D_h(x)$ relative to a generator polynomial $g_{h,h+1}(x)$, $r_{h+1}(x)$ represents a remainder of $x^P D_h(x)$ relative to the generator polynomial $g_{h,h+1}(x)$, and a relationship among generator polynomials $g_{h,h+1}(x)$, $g_h(x)$, and $g_{h+1}(x)$ is expressed by a formula $g_{h+1}(x) = g_h(x) \times g_{h,h+1}(x)$.

With reference to the second aspect or the first possible implementation of the second aspect, in a second possible implementation, a specific implementation is: a value of L is 3, a value of P is 8, a value of $N_0$ is 520, and a value of K is 514; or a value of L is 1, a value of P is 16, a value of $N_0$ is 528, and a value of K is 514.

With reference to the second aspect, the first possible implementation of the second aspect, or the second possible implementation of the second aspect, in a third possible implementation, the method further includes: when the multimode RS FEC encoder performs encoding in the RS ($N_j$, K) operating mode, filling a code word whose length is $N_j$ with a fixed sequence until the length reaches $N_L$, where j<L.

With reference to any one of the second aspect, or the first to the third possible implementations of the second aspect, in a fourth possible implementation, the method further includes: selecting, as a code pattern used for encoding, a code pattern fed back by a multimode RS FEC decoder on a decoder side; and performing encoding according to the fed back code pattern, and sending a result of the encoding to the multimode RS FEC decoder.

According to a third aspect, a multimode RS FEC decoder is provided, where the multimode RS FEC decoder has a total of (L+1) RS ($N_i$, K) operating modes, i=0, 1, . . . , and L, L is an integer greater than 0, and $N_i$ represents a length of an RS FEC code word in a corresponding operating mode; and $N_i = N_0 + i \times P$, $N_0$ represents a shortest length of an RS FEC code word in the multimode RS FEC decoder, P is a positive integer, and K represents a quantity of information symbols in the RS FEC code word, where the multimode RS FEC decoder includes an eigenvalue calculation unit, a key equation solving unit, a Chien search unit, an error value calculation unit, an error correction unit, and a frame buffer unit; and the eigenvalue calculation unit includes $N_L-K$ eigenvalue calculation subunits and a first control subunit, and the key equation solving unit includes $3(N_L-K)/2+1$ key equation solving subunits and a second control subunit; and when the multimode RS FEC decoder performs decoding in the RS ($N_i$, K) operating mode, the eigenvalue calculation unit is configured to calculate $N_i-K$ eigenvalues according to $N_i$ code words of a received current FEC frame, where calculation of each eigenvalue is completed by a respective eigenvalue calculation subunit, and the first control subunit controls first $N_i-K$ eigenvalue calculation subunits in the $N_L-K$ eigenvalue calculation subunits to be enabled to calculate the $N_i-K$ eigenvalues;

the key equation solving unit is configured to: receive the $N_i-K$ eigenvalues, and calculate an error location polynomial and an error value polynomial according to the $N_i-K$ eigenvalues; and the second control subunit is configured to: control first $3(N_i-K)/2+1$ eigenvalue calculation subunits in the $3(N_L-K)/2+1$ key equation solving subunits to be enabled to calculate the error location polynomial $\Lambda(x)$ and the error value polynomial $\Omega(x)$; and send the error location polynomial $\Lambda(x)$ to the Chien search unit, and send the error value polynomial $\Omega(x)$ to the error value calculation unit;

the Chien search unit is configured to: determine an error location of the current FEC frame by exhausting a root of the error location polynomial $\Lambda(x)$, and send a polynomial $x\Lambda'(x)$ to the error value calculation unit, where the polynomial $x\Lambda'(x)$ represents a sum of odd terms in $\Lambda(x)$;

the error value calculation unit is configured to calculate, according to the error value polynomial $\Omega(x)$ and the sum $x\Lambda'(x)$ of the odd terms in the error location polynomial $\Lambda(x)$, an error correction value corresponding to the error location of the current FEC frame;

the frame buffer unit is configured to cache the current FEC frame until the error value calculation unit obtains, by calculation, the error correction value corresponding to the error location of the current FEC frame; and the error correction unit is configured to perform error correction on the current FEC frame according to the error correction value corresponding to the error location of the current FEC frame and the current FEC frame cached by the frame buffer unit.

With reference to the third aspect, in a first possible implementation, the multimode RS FEC decoder further includes a statistics collecting unit and a code pattern feedback unit;

the statistics collecting unit is configured to collect statistics about a bit error rate obtained when transmission is performed in the RS ($N_i$, K) operating mode; and the code pattern feedback unit is configured to: when the bit error rate is greater than a preset upper threshold, select an RS ($N_{i+1}$, K) code pattern, and feed back the RS ($N_{i+1}$, K) code pattern to a multimode RS FEC encoder on an encoder side; or when the bit error rate is less than a preset lower threshold, select an RS ($N_{i-1}$, K) code pattern, and feed back the RS ($N_{i-1}$, K) code pattern to a multimode RS FEC encoder on an encoder side.

With reference to the third aspect or the first possible implementation of the third aspect, in a second possible implementation, the multimode RS FEC decoder further includes a de-fill unit, configured to: when the multimode RS FEC decoder operates in the RS ($N_i$, K) operating mode and i<L, intercept a code word whose length is $N_i$ from a code word whose length is $N_L$ to perform decoding.

Based on the foregoing technical solutions, according to the encoding method, the encoder, and the decoder for dynamic power consumption control provided in the embodiments of the present invention, when being in the RS ($N_{h+1}$, K) operating mode, the multimode RS FEC encoder performs incremental encoding according to a quotient and a remainder that are obtained when the multimode RS FEC encoder is in an RS ($N_h$, K) operating mode, so that an encoding result in the RS ($N_{h+1}$, K) operating mode is obtained and an encoding result in the RS ($N_h$, K) operating mode can be multiplexed, so as to reduce power consumption caused by unnecessary encoding calculation and improve system performance of the encoder.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Figure 1:
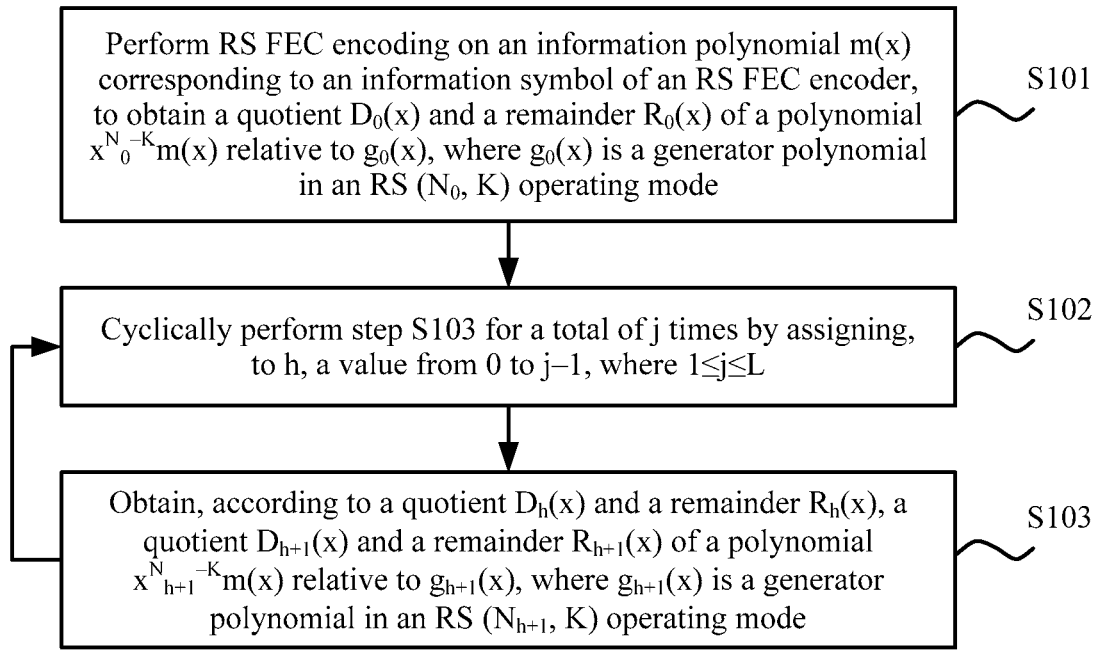
FIG. 1 is a flowchart of an encoding method used for a multimode RS FEC encoder according to an embodiment of the present invention.

FIG. 1 is a flowchart of an encoding method used for a multimode RS FEC encoder according to an embodiment of the present invention. In this embodiment of the present invention, the multimode RS FEC encoder has a total of (L+1) RS ($N_i$, K) operating modes, where i=0, 1, . . . , and L, L is an integer greater than 0, and $N_i$ represents a length of an RS FEC code word in a corresponding operating mode; and $N_i = N_0 + i \times P$, $N_0$ represents a shortest length of an RS FEC code word in the multimode RS FEC encoder, P is a positive integer, and K represents a quantity of information symbols in the RS FEC code word. When the multimode RS FEC encoder performs encoding in an RS ($N_j$, K) operating mode (1≤j≤L), the encoding method shown in FIG. 1 includes the following steps:

S101. Perform RS FEC encoding on an information polynomial m(x) corresponding to an information symbol of the RS FEC encoder, to obtain a quotient $D_0(x)$ and a remainder $R_0(x)$ of a polynomial $x^{N_0-K}m(x)$ relative to $g_0(x)$, where $g_0(x)$ is a generator polynomial in an RS ($N_0$, K) operating mode.

It should be understood that, the information polynomial m(x) corresponding to the information symbol of the RS FEC encoder is used to represent the information symbol of the RS FEC encoder in a polynomial form.

S102. Cyclically perform step S103 for a total of j times by assigning, to h, a value from 0 to j−1, where 1≤j≤L, h is an integer, and 0≤h≤j−1.

S103. Obtain, according to a quotient $D_h(x)$ and a remainder $R_h(x)$, a quotient $D_{h+1}(x)$ and a remainder $R_{h+1}(x)$ of a polynomial $x^{N_{h+1}-K}m(x)$ relative to $g_{h+1}(x)$, where $g_{h+1}(x)$ is a generator polynomial in an RS ($N_{h+1}$, K) operating mode.

In this embodiment of the present invention, when being in the RS ($N_{h+1}$, K) operating mode, the multimode RS FEC encoder performs incremental encoding according to a quotient and a remainder that are obtained when the multimode RS FEC encoder is in an RS ($N_h$, K) operating mode, so that an encoding result in the RS ($N_{h+1}$, K) operating mode is obtained and an encoding result in the RS ($N_h$, K) operating mode can be multiplexed, so as to reduce power consumption caused by unnecessary encoding calculation and improve system performance of the encoder.

Optionally, a relationship between $D_{h+1}(x)$ and $R_{h+1}(x)$ is expressed by a formula (1), and a relationship between $D_h(x)$ and $R_h(x)$ is expressed by a formula (2):

$$R_{h+1}(x) = r_{h+1}(x) \times g_h(x) + x^P R_h(x) \qquad \text{formula (1); and}$$

$$D_{h+1}(x) = d_{h+1}(x) \qquad \text{formula (2).}$$

$d_{h+1}(x)$ represents a quotient of $x^P D_h(x)$ relative to a generator polynomial $g_{h,h+1}(x)$, $r_{h+1}(x)$ represents a remainder of $x^P D_h(x)$ relative to the generator polynomial $g_{h,h+1}(x)$, and a relationship among generator polynomials $g_{h,h+1}(x)$, $g_h(x)$, and $g_{h+1}(x)$ is expressed by a formula $g_{h+1}(x) = g_h(x) \times g_{h,h+1}(x)$.

It should be understood that, the quotient of $x^P D_h(x)$ relative to the generator polynomial $g_{h,h+1}(x)$ is a quotient obtained by dividing $x^P D_h(x)$ by $g_{h,h+1}(x)$, and the remainder of $x^P D_h(x)$ relative to the generator polynomial $g_{h,h+1}(x)$ is a remainder obtained by dividing $x^P D_h(x)$ by $g_{h,h+1}(x)$.

It should be understood that, in the method shown in FIG. 1, a value of P may be any positive integer. Optionally, the value of P may be a degree of parallelism of the multimode RS FEC encoder.

Optionally, in an embodiment, a value of L is 3, a value of P is 8, a value of $N_0$ is 520, and a value of K is 514. In this case, the multimode RS FEC encoder has a total of four operating modes: RS (520, 514), RS (528, 514), RS (536, 514), and RS (544, 514), that is, four code pattern groups.

Optionally, in another embodiment, a value of L is 1, a value of P is 16, a value of $N_0$ is 528, and a value of K is 514. In this case, the multimode RS FEC encoder has a total of two operating modes: RS (528, 514) and RS (544, 514), that is, two code pattern groups.

Optionally, the method may further include: when the multimode RS FEC encoder performs encoding in the RS ($N_j$, K) operating mode, filling a code word whose length is $N_j$ with a fixed sequence until the length reaches $N_L$, where j<L. The code word in the RS ($N_j$, K) operating mode is filled in until the length reaches $N_L$, so that all current encoders in the multimode RS FEC encoder share a same clock cycle.

The following further describes the method in this embodiment of the present invention with reference to a specific embodiment.

In an example of a two-mode RS FEC encoder, the two-mode RS FEC encoder has two operating modes: RS ($N_0$, K) and RS ($N_1$, K).

It is assumed that a generator polynomial in the RS ($N_0$, K) operating mode is $$g_0(x) = \prod_{i=0}^{2T_0-1} (x - \alpha^i),$$

where $T_0 = (N_0 - K)/2$.

A generator polynomial is defined as $$g_{0,1}(x) = \prod_{i=2T_0}^{2T_1-1} (x - \alpha^i),$$

where $T_1 = (N_1 - K)/2$.

A generator polynomial $$g_1(x) = \prod_{i=0}^{2T_1-1} (x - \alpha^i) = g_0(x) \cdot g_{0,1}(x)$$

in the RS ($N_1$, K) operating mode may be easily deduced from the polynomial $g_0(x)$ and the polynomial $g_{0,1}(x)$ A quotient $D_0(x)$ and a remainder $R_0(x)$ may be obtained by using an encoding formula (formula (3)) in the RS ($N_0$, K) operating mode:

$$x^{N_0-K} \cdot m(x) = D_0(x) \cdot g_0(x) + R_0(x) \qquad \text{formula (3)}.$$

m(x) represents an information polynomial corresponding to an information symbol of the RS FEC encoder, the information polynomial is a K-order polynomial, $x^{N_0-K} \cdot m(x)$ represents an $N_0$-order polynomial obtained after the information polynomial m(x) is shifted, $D_0(x)$ represents a quotient obtained after encoding is performed on the information polynomial m(x) in the RS ($N_0$, K) operating mode, and $R_0(x)$ represents a remainder obtained after encoding is performed on the information polynomial m(x) in the RS ($N_0$, K) operating mode.

It can be deduced from the formula (3) that, the quotient $D_0(x)$ is equal to a quotient of $x^{N_0-K} \cdot m(x)$ relative to $g_0(x)$, that is, a quotient obtained after the polynomial $x^{N_0-K} \cdot m(x)$ is divided by the polynomial $g_0(x)$; the remainder $R_0(x)$ is equal to a remainder of $x^{N_0-K} \cdot m(x)$ relative to $g_0(x)$, that is, a remainder obtained after the polynomial $x^{N_0-K} \cdot m(x)$ is divided by the polynomial $g_0(x)$ A quotient $d_1(x)$ and a remainder $r_1(x)$ may be obtained by further performing encoding on $D_0(x)$ by using $g_{0,1}(x)$ as a generator polynomial:

$$x^{N_1-N_0} \cdot D_0(x) = d_1(x) g_{0,1}(x) + r_1(x) \qquad \text{formula (4)}.$$

It can be deduced from the formula (4) that, the quotient $d_1(x)$ is equal to a quotient of $x^{N_1-N_0} \cdot D_0(x)$ relative to $g_{0,1}(x)$, that is, a quotient obtained after the polynomial $x^{N_1-N_0} \cdot D_0(x)$ is divided by the polynomial $g_{0,1}(x)$; the remainder $r_1(x)$ is equal to a remainder of $x^{N_1-N_0} \cdot D_0(x)$ relative to $g_{0,1}(x)$, that is, a remainder obtained after the polynomial $x^{N_1-N_0} \cdot D_0(x)$ is divided by the polynomial $g_{0,1}(x)$ The quotient $D_1(x)$ and the remainder $R_1(x)$ may be obtained by using an encoding formula (formula (5)) in the RS ($N_1$, K) operating mode:

$$x^{N_1-K} \cdot m(x) = D_1(x) \cdot g_1(x) + R_1(x) \qquad \text{formula (5)}.$$

It can be deduced from the formula (5) that, the quotient $D_1(x)$ is equal to a quotient of $x^{N_1-K} \cdot m(x)$ relative to $g_1(x)$, that is, a quotient obtained after the polynomial $x^{N_1-K} \cdot m(x)$ is divided by the polynomial $g_1(x)$ the remainder $R_1(x)$ is equal to a remainder of $x^{N_1-K} \cdot m(x)$ relative to $g_1(x)$, that is, a remainder obtained after the polynomial $x^{N_1-K} \cdot m(x)$ is divided by the polynomial $g_1(x)$ The formula (4) is compared with the formula (5), and the following formulas may be obtained with reference to the formula (3):

$$D_1(x) = d_1(x) \qquad \text{formula (6); and}$$

$$R_1(x) = r_1(x) \cdot g_0(x) + x^{N_1-N_0} \cdot R_0(x) = r_1(x) \cdot g_0(x) + x^P \cdot R_0(x) \qquad \text{formula(7)}.$$

In this case, an entire process of implementing RS ($N_1$, K) encoding in an incremental encoding manner by using an RS ($N_0$, K) encoding result is provided in a deduction procedure of the formula (6) and the formula (7). An entire theoretical calculation procedure may be provided by the following formula:

$$RS(N_0, K) \begin{cases} m(x) + \dfrac{\text{Known polynomial}}{g_0(x)} \\ \Downarrow \\ \dfrac{\text{To-be-calculated polynomial}}{D_0(x), R_0(x)} + \dfrac{\text{Known polynomial}}{g_{01}(x)} \\ \Downarrow \end{cases}$$

$$\text{Increment part} \begin{cases} d_1(x), r_1(x) + \dfrac{\text{Known polynomial}}{R_0(x), g_0(x)} \\ \Downarrow \\ \dfrac{\text{To-be-calculated polynomial}}{D_1(x), R_1(x)} \end{cases} \Bigg\} RS(N_1, K)$$

That is, RS ($N_1$, K) encoding may be implemented by performing encoding calculation of the increment part on a basis of the RS ($N_0$, K) encoding result.

The encoding method for the two-mode RS FEC encoder may be further applied to an application scenario of a multimode RS FEC encoder. It is assumed that a generator polynomial in an RS ($N_h$, K) operating mode is $g_h(x)$, a quotient $D_h(x)$ and a remainder $R_h(x)$ are obtained by performing encoding on an information polynomial m(x) in the RS ($N_h$, K) operating mode. A generator polynomial in an RS ($N_{h+1}$, K) operating mode is $g_{h+1}(x)$, a quotient $D_{h+1}(x)$ and a remainder $R_{h+1}(x)$ are obtained by performing encoding on the information polynomial m(x) in the RS ($N_{h+1}$, K) operating mode, and the quotient $D_{h+1}(x)$ and the remainder $R_{h+1}(x)$ may be expressed by the following formulas:

$$R_{h+1}(x) = r_{h+1}(x) \times g_h(x) + x^P R_h(x) \qquad \text{formula (8); and}$$

$$D_{h+1}(x) = d_{h+1}(x) \qquad \text{formula (9)}.$$

$d_{h+1}(x)$ represents a quotient of $x^P D_h(x)$ relative to a generator polynomial $g_{h,h+1}(x)$, $r_{h+1}(x)$ represents a remainder of $x^P D_h(x)$ relative to the generator polynomial $g_{h,h+1}(x)$, and a relationship among generator polynomials $g_{h,h+1}(x)$, $g_h(x)$, and $g_{h+1}(x)$ is expressed by a formula $g_{h+1}(x) = g_h(x) \times g_{h,h+1}(x)$.

In addition, it is assumed that the multimode RS FEC encoder has (L+1) RS ($N_i$, K) operating modes, where $N_i = N_0 + i \times P$, i=0, 1, 2, ..., and L, P is a positive integer, and L is an integer greater than 1. When the multimode RS FEC encoder operates in the RS ($N_i$, K) operating mode and i<L, a code word whose length is $N_i$ may be further filled with a fixed sequence until the length reaches $N_L$. In this embodiment of the present invention, if the code word in the RS ($N_i$, K) operating mode has a fixed length $N_L$, the multimode RS FEC encoder can maintain a same bit rate in the RS ($N_i$, K) operating mode and an RS ($N_L$, K) operating mode, and clock mismatch caused in an operating mode switchover process can be avoided.

In addition, the multimode RS FEC encoder may further switch, according to an operating mode that is fed back by a multimode RS FEC decoder on a decoder side, an operating mode of the multimode RS FEC encoder to the fed-back operating mode, and perform encoding.

Figure 2:
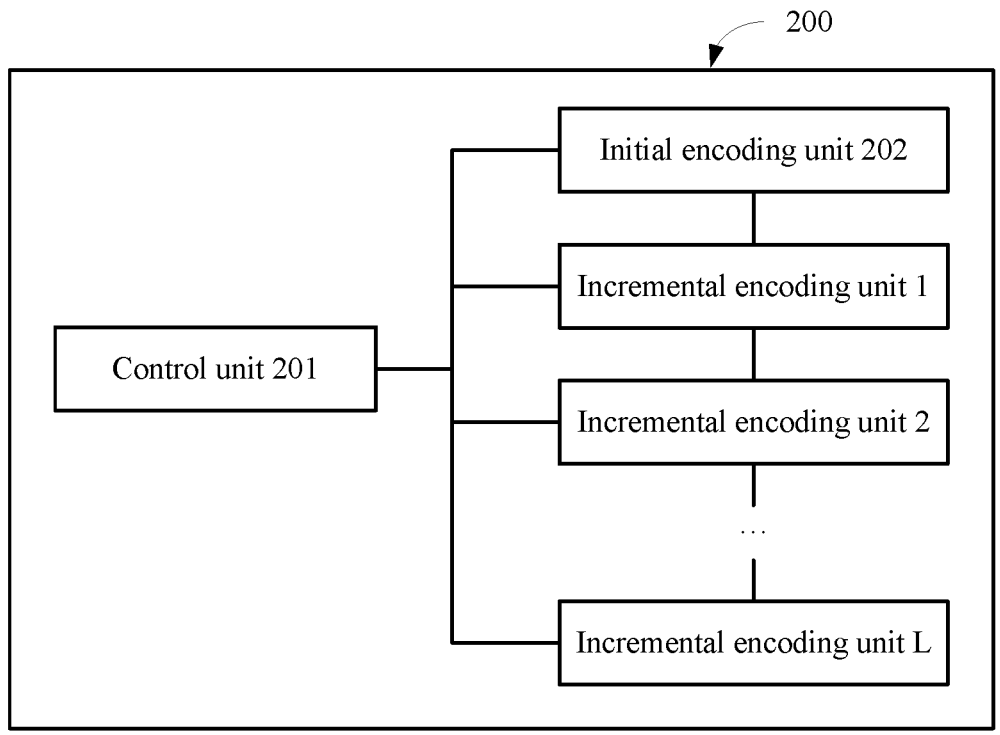
FIG. 2 is a schematic structural diagram of a multimode RS FEC encoder according to an embodiment of the present invention.

FIG. 2 is a schematic structural diagram of a multimode RS FEC encoder 200 according to an embodiment of the present invention. The multimode RS FEC encoder 200 has a total of (L+1) RS ($N_i$, K) operating modes, where i=0, 1, ..., and L, L is an integer greater than 0, and $N_i$ represents a length of an RS FEC code word in a corresponding operating mode; and $N_i = N_0 + i \times P$, $N_0$ represents a shortest length of an RS FEC code word in the multimode RS FEC encoder 200, P is a positive integer, and K represents a quantity of information symbols in the RS FEC code word. As shown in FIG. 2, the multimode RS FEC encoder 200 may include a control unit 201, an initial encoding unit 202, and L incremental encoding units including an incremental encoding unit 1 to an incremental encoding unit L.

The control unit 201 is configured to control a unit and a module that need to be enabled when the multimode RS FEC encoder performs encoding, and is specifically configured to enable only the initial encoding unit in an RS ($N_0$, K) operating mode to perform encoding or enable only the initial encoding unit and first j incremental encoding units in the L incremental encoding units in an RS ($N_j$, K) operating mode to perform encoding, where j is an integer, and 1≤j≤L.

The initial encoding unit 202 is configured to perform RS FEC encoding on an information polynomial m(x) to obtain a quotient $D_0(x)$ and a remainder $R_0(x)$ of a polynomial $x^{N_0-K} m(x)$ relative to $g_0(x)$, where $g_0(x)$ is a generator polynomial in the RS ($N_0$, K) operating mode.

An $(h+1)^{th}$ incremental encoding unit (an incremental encoding unit h+1) in the L incremental encoding units is configured to obtain, according to a quotient $D_h(x)$ and a remainder $R_h(x)$, a quotient $D_{h+1}(x)$ and a remainder $R_{h+1}(x)$ of a polynomial $x^{N_{h+1}-K} m(x)$ relative to $g_{h+1}(x)$, where $g_{h+1}(x)$ is a generator polynomial in an RS ($N_{h+1}$, K) operating mode, h is an integer, and 0≤h≤L-1.

It can be learned from functions of the initial encoding unit 202 and the incremental encoding units 1 to L that, the quotient $D_0(x)$ and the remainder $R_0(x)$ are a quotient and a remainder that are obtained after the initial encoding unit 202 performs encoding on the information polynomial m(x), and are also input parameters of the incremental encoding unit 1. A quotient $D_1(x)$ and a remainder $R_1(x)$ that are obtained by performing encoding by the incremental encoding unit 1 according to the quotient $D_0(x)$ and the remainder $R_0(x)$ are equal to a quotient and a remainder that are obtained by performing encoding on the information polynomial m(x) in an RS ($N_1$, K) operating mode, and by analogy, quotients and remainders may be obtained by performing encoding on the information polynomial m(x) in the (L+1) RS ($N_i$, K) operating modes, where i=0, 1, ..., and L.

In addition, it should be understood that, in this embodiment of the present invention, the L incremental encoding units have similar functions, but it does not mean that the L incremental encoding units have a same function or may be interchanged. The L incremental encoding units are different from each other, and logic circuits implemented by the L incremental encoding units are also different.

In this embodiment of the present invention, when being in the RS ($N_{h+1}$, K) operating mode, the multimode RS FEC encoder performs incremental encoding according to a quotient and a remainder that are obtained when the multimode RS FEC encoder is in an RS ($N_h$, K) operating mode, so that an encoding result in the RS ($N_{h+1}$, K) operating mode is obtained and an encoding result in the RS ($N_h$, K) operating mode can be multiplexed, so as to reduce power consumption caused by unnecessary encoding calculation and improve system performance of the encoder to some extent.

Optionally, a relationship between $D_{h+1}(x)$ and $R_{h+1}(x)$ and a relationship between $D_h(x)$ and $R_h(x)$ are expressed by a formula (10) and a formula (11):

$$R_{h+1}(x) = r_{h+1}(x) * g_h(x) + x^P R_h(x) \qquad \text{formula (10); and}$$

$$D_{h+1}(x) = d_{h+1}(x) \qquad \text{formula (11).}$$

$d_{h+1}(x)$ represents a quotient of $x^P D_h(x)$ relative to a generator polynomial $g_{h,h+1}(x)$, $r_{h+1}(x)$ represents a remainder of $x^P D_h(x)$ relative to the generator polynomial $g_{h,h+1}(x)$, and a relationship among generator polynomials $g_{h,h+1}(x)$, $g_h(x)$, and $g_{h+1}(x)$ is expressed by a formula $g_{h+1}(x) = g_h(x) \times g_{h,h+1}(x)$.

Figure 3:
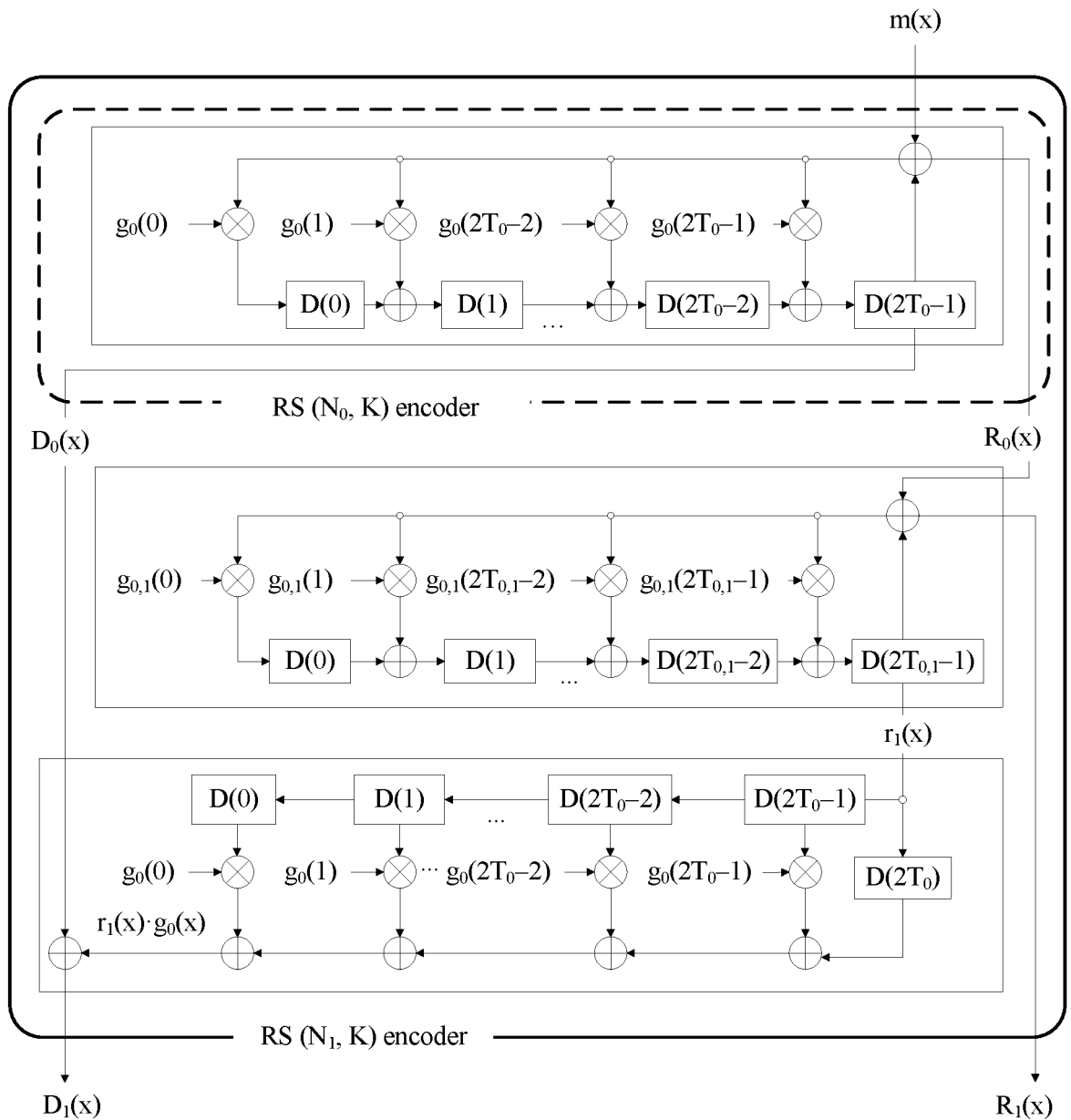
FIG. 3 is a schematic circuit diagram of a serial increment encoder according to an embodiment of the present invention.

FIG. 3 is a schematic circuit diagram of a serial increment encoder according to an embodiment of the present invention. As shown in FIG. 3, a circuit in a dashed line box is a logic circuit of an RS ($N_0$, K) encoder, and a circuit in a solid line box is a logic circuit of an RS ($N_1$, K) encoder. It can be learned from FIG. 3 that, the RS ($N_1$, K) encoder may be implemented by adding a part of an incremental encoding circuit on a basis of the RS ($N_0$, K) encoder, a quotient and a remainder that are obtained after the RS ($N_0$, K) encoder performs encoding on an information polynomial m(x) are used as input parameters of the incremental encoding circuit, and a quotient and a remainder that are output by the incremental encoding circuit are a quotient and a remainder that are obtained after the RS ($N_1$, K) encoder performs encoding on the information polynomial m(x).

In the RS ($N_0$, K) encoder, $g_0(0)$ to $g_0(2T_0-1)$ are respectively a term of $0^{th}$ power to a term of $(2T_0-1)^{th}$ power of a generator polynomial $g_0(x)$, D(0) to D($2T_0-1$) are encoding result registers, and $T_0 = (N_0-K)/2$; $g_{0,1}(0)$ to $g_{0,1}(2T_{0,1}-1)$ are respectively a term of $0^{th}$ power to a term of $(2T_{0,1}-1)^{th}$ power of a generator polynomial $g_{0,1}(x)$, $g_{0,1}(x) = g_1(x)/g_0(x)$, and $T_{0,1} = T_1 - T_0 = P/2$. $g_1(x)$ represents a generator polynomial of the RS ($N_1$, K) encoder.

Optionally, a value of L is 3, a value of P is 8, a value of $N_0$ is 520, and a value of K is 514. That is, the multimode RS FEC encoder 200 is a four-mode RS (520/528/536/544, 514) encoder.

Alternatively, optionally, a value of L is 1, a value of P is 16, a value of $N_0$ is 528, and a value of K is 514. That is, the multimode RS FEC encoder 200 is a two-mode RS (528/544, 514) encoder.

Figure 4:
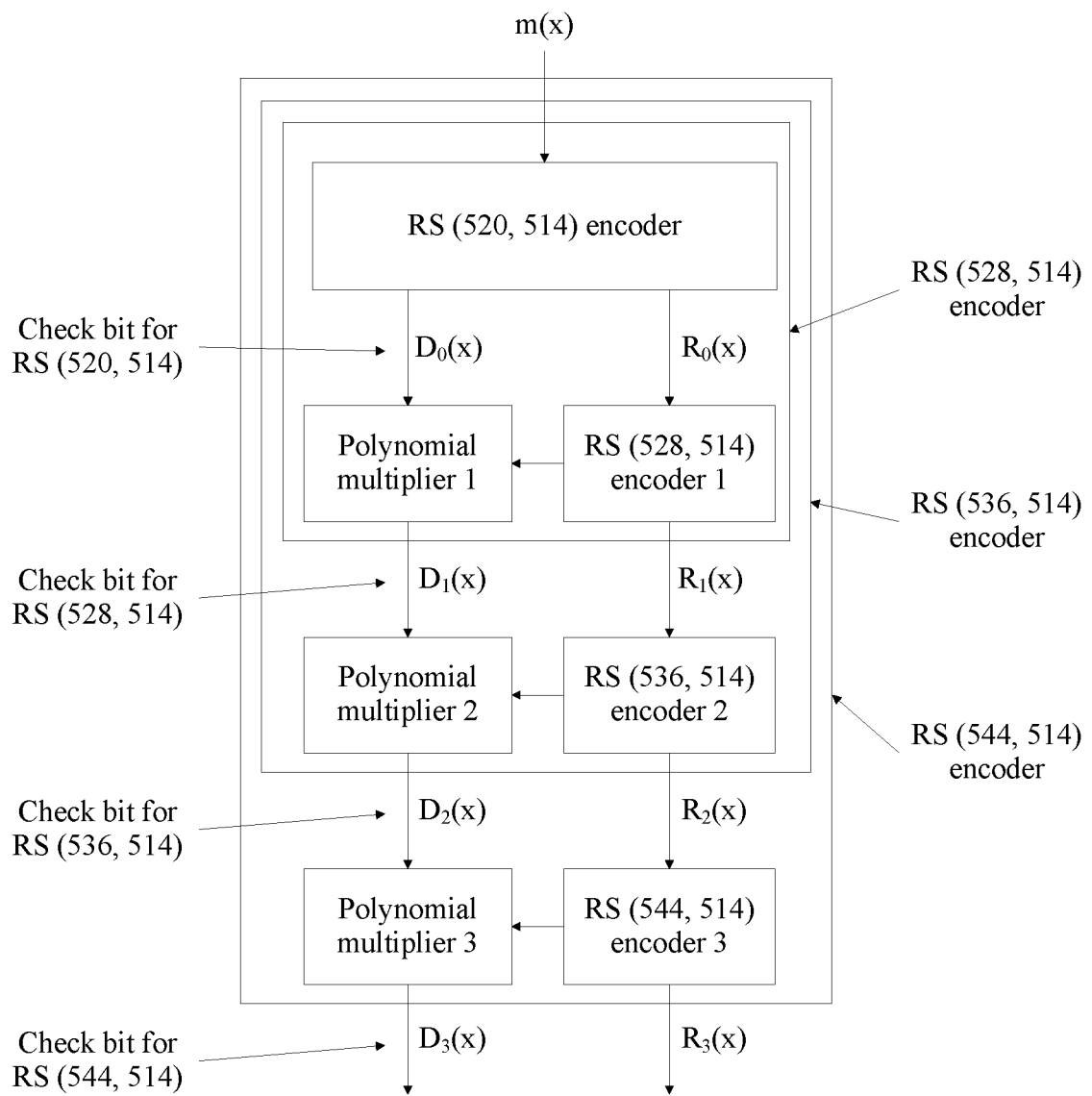
FIG. 4 is a schematic structural diagram of a four-mode RS FEC encoder according to an embodiment of the present invention.

FIG. 4 is a schematic structural diagram of a four-mode RS FEC encoder according to an embodiment of the present invention. In FIG. 4, a four-mode RS (520/528/536/544, 514) encoder is used as an example. It can be learned from the diagram that, each stage of RS ($N_i$, K) encoder may be implemented by adding some functions on a basis of a circuit of a previous stage of RS ($N_{i-1}$, K) encoder. That is, when the circuit operates in an RS ($N_{i-1}$, K) operating mode, an increment circuit part required by the RS ($N_i$, K) encoder may be disabled, so as to reduce power consumption. In addition, each stage of circuit may be partitioned by inserting a register into an output location $D_i(x)$, $R_i(x)$ of each stage of circuit, to implement a pipelining operation, where i≥1. Compared with an independently implemented RS (544, 514) encoder whose feedback matrix is on a scale of 30×30, a scale of a maximum feedback matrix is reduced to 8×8 by using the solution shown in FIG. 4, thereby greatly reducing a scale of a feedback matrix.

This embodiment of the present invention further discloses a multimode RS FEC decoder. The multimode RS FEC decoder has a total of (L+1) RS ($N_i$, K) operating modes, where i=0, 1, . . . , and L, L is an integer greater than 0, and $N_i$ represents a length of an RS FEC code word in a corresponding operating mode; and $N_i=N_0+i\times P$, $N_0$ represents a shortest length of an RS FEC code word in the multimode RS FEC decoder, P is a positive integer, and K represents a quantity of information symbols in the RS FEC code word. The multimode RS FEC decoder includes an eigenvalue calculation unit, a key equation solving unit, a Chien search unit, an error value calculation unit, an error correction unit, and a frame buffer unit. The eigenvalue calculation unit includes $N_L$–K eigenvalue calculation subunits and a first control subunit, and the key equation solving unit includes $3(N_L-K)/2+1$ key equation solving subunits and a second control subunit. When the multimode RS FEC decoder performs decoding in the RS ($N_i$, K) operating mode, the eigenvalue calculation unit is configured to calculate $N_i$–K eigenvalues according to $N_i$ code words of a received current FEC frame, where calculation of each eigenvalue is completed by a respective eigenvalue calculation subunit, and the first control subunit controls first $N_i$–K eigenvalue calculation subunits in the $N_L$–K eigenvalue calculation subunits to be enabled to calculate the $N_i$–K eigenvalues.

The key equation solving unit is configured to: receive the $N_i$–K eigenvalues, and calculate an error location polynomial and an error value polynomial according to the $N_i$–K eigenvalues. The second control subunit is configured to: control first $3(N_i-K)/2+1$ eigenvalue calculation subunits in the $3(N_L-K)/2+1$ key equation solving subunits to be enabled to calculate the error location polynomial $\Lambda(x)$ and the error value polynomial $\Omega(x)$; and send the error location polynomial $\Lambda(x)$ to the Chien search unit, and send the error value polynomial $\Omega(x)$ to the error value calculation unit.

The Chien search unit is configured to: determine an error location of the current FEC frame by exhausting a root of the error location polynomial $\Lambda(x)$, and send a polynomial $x\Lambda'(x)$ to the error value calculation unit, where the polynomial $x\Lambda'(x)$ represents a sum of odd terms in $\Lambda(x)$ The error value calculation unit is configured to calculate, according to the error value polynomial $\Omega(x)$ and the sum $x\Lambda'(x)$ of the odd terms in the error location polynomial $\Lambda(x)$, an error correction value corresponding to the error location of the current FEC frame.

The frame buffer unit is configured to cache the current FEC frame until the error value calculation unit obtains, by calculation, the error correction value corresponding to the error location of the current FEC frame.

The error correction unit is configured to perform error correction on the current FEC frame according to the error correction value corresponding to the error location of the current FEC frame and the current FEC frame cached by the frame buffer unit.

In this embodiment of the present invention, a unit and a module that are used during decoding are controlled according to an operating mode during decoding, so that unnecessary calculation overheads can be reduced and a consumption level of the decoder can be further lowered.

Certainly, it should be understood that, in this embodiment of the present invention, a control subunit that is in each unit of the multimode RS FEC decoder and that is configured to control a use status of a basic unit may be implemented by one control subunit (or a control circuit) in a unified way.

Optionally, the multimode RS FEC decoder further includes a statistics collecting unit and a code pattern feedback unit. The statistics collecting unit is configured to collect statistics about a bit error rate obtained when transmission is performed in the RS ($N_i$, K) operating mode. The code pattern feedback unit is configured to: when the bit error rate is greater than a preset upper threshold, select an RS ($N_{i+1}$, K) code pattern, and feed back the RS ($N_{i+1}$, K) code pattern to a multimode RS FEC encoder on an encoder side; or when the bit error rate is less than a preset lower threshold, select an RS ($N_{i-1}$, K) code pattern, and feed back the RS ($N_{i-1}$, K) code pattern to a multimode RS FEC encoder on an encoder side.

Optionally, the multimode RS FEC decoder further includes a de-fill unit, configured to: when the multimode RS FEC decoder operates in the RS ($N_i$, K) operating mode and i<L, intercept a code word whose length is $N_i$ from a code word whose length is $N_L$ to perform decoding. It should be understood that, code words to be selected by the decoder side for decoding may be agreed upon by the decoder side and the encoder side in advance, or may be notified to the decoder side by the encoder side.

With reference to a specific embodiment, the following further describes the multimode RS FEC decoder and a decoding method for the multimode RS FEC decoder in this embodiment of the present invention.

Figure 5:
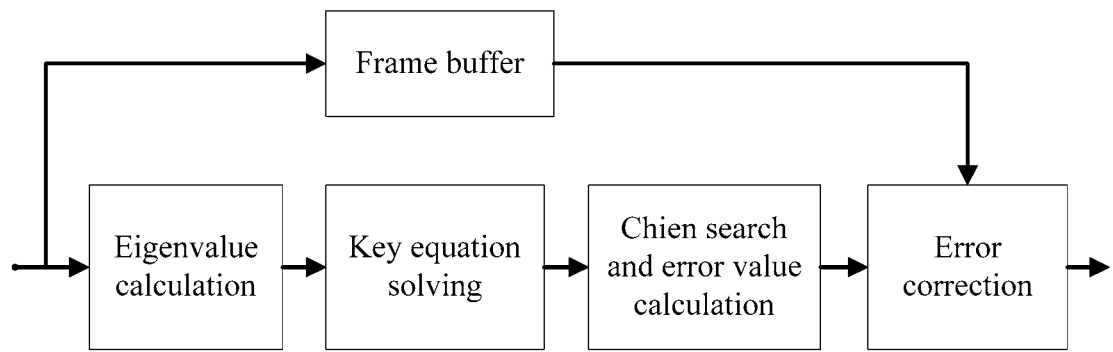
FIG. 5 is a schematic diagram of a decoding procedure according to an embodiment of the present invention.

FIG. 5 is a schematic diagram of a decoding procedure of a multimode RS FEC decoder according to an embodiment of the present invention. As shown in FIG. 5, after receiving a current RS FEC frame, the multimode RS FEC decoder performs a frame buffer operation on the current RS FEC frame, and performs eigenvalue calculation, key equation solving, Chien search, and error value calculation according to the current RS FEC frame, to obtain a decoded current RS FEC frame according to an error location obtained by calculation and a corresponding error correction value and with reference to the cached current RS FEC frame.

Figure 6:
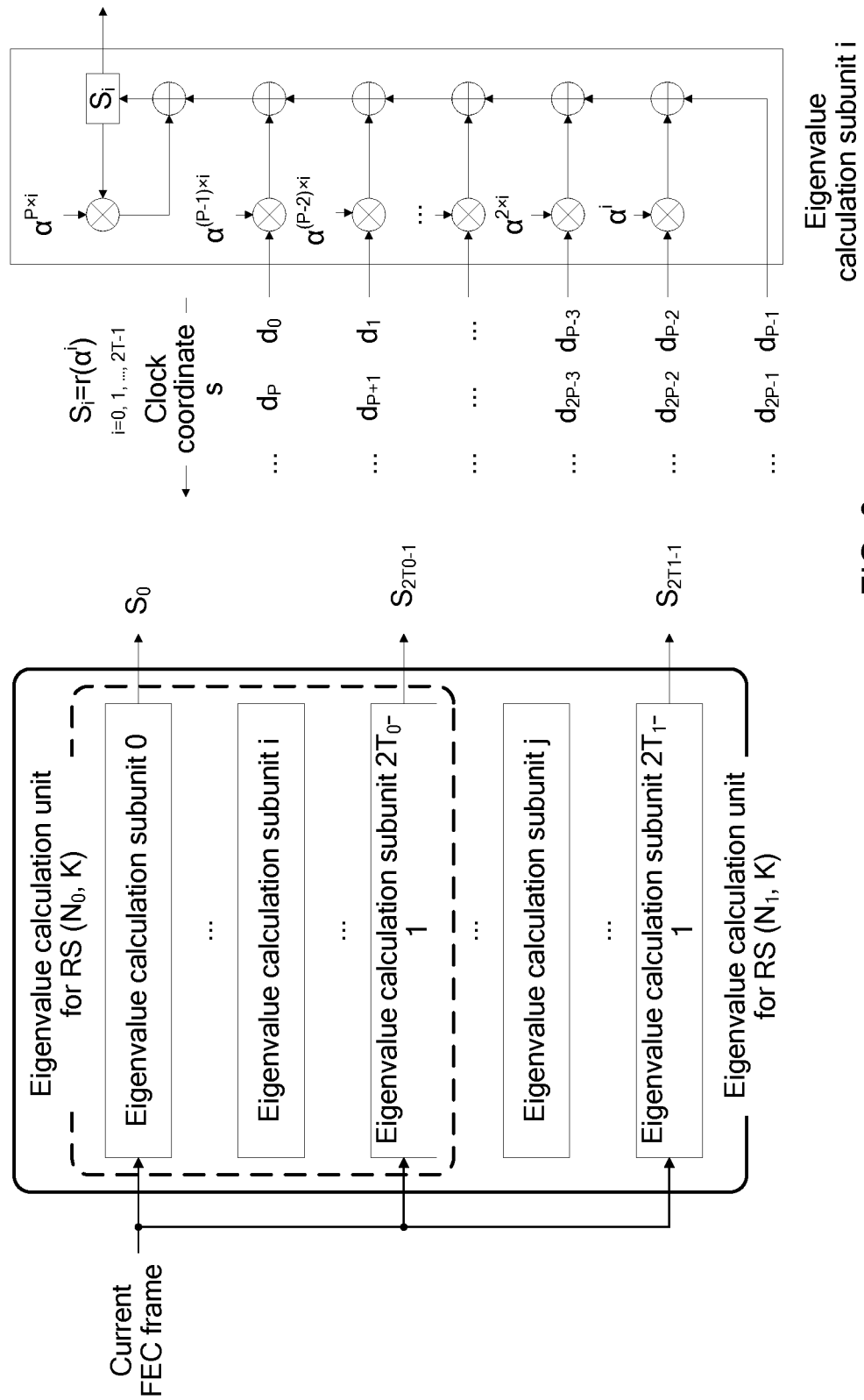
FIG. 6 is a schematic circuit diagram of eigenvalue calculation by a multimode RS FEC decoder according to an embodiment of the present invention.

FIG. 6 is a schematic circuit diagram of eigenvalue calculation by a multimode RS FEC decoder according to an embodiment of the present invention. An eigenvalue of the multimode RS FEC decoder is defined as:

$$S_i = r(x)|_{x=\alpha^i} = \sum_{k=0}^{N-1} r_k \cdot x^k \bigg|_{x=\alpha^i}. \quad \text{formula (12)}$$

N represents a length of a code word of the multimode RS FEC decoder, and $r_k$ is corresponding to an information symbol in a received RS FEC frame, where k=0~N−1. Addition and multiplication in $$\sum_{k=0}^{N-1} r_k \cdot x^k$$

are addition and multiplication in a finite field, $x=\alpha^i$ is a solution to a generator polynomial of the multimode RS FEC decoder, $S_i$ represents an $i^{th}$ eigenvalue of the multimode RS FEC decoder, and $0 \le i \le 2T-1$. In an example of an RS $(N_0, K)$ mode, for a generator polynomial $$g_0(x) = \prod_{i=0}^{2T_0-1} (x - \alpha^i),$$

there are a total of $2T_0-1$ solutions: $\alpha^0, \alpha^1, \ldots, \alpha^{2T_0-1}$, and $2T_0-1$ eigenvalues in the RS $(N_0, K)$ mode may be correspondingly obtained.

Each eigenvalue calculation subunit is corresponding to calculation of one eigenvalue. In the RS $(N_0, K)$ mode, only units 0 to $T_0-1$ are enabled, as shown in a dashed line box area in the diagram. In an RS $(N_1, K)$ mode, units 0 to $T_1-1$ are further enabled (that is, the units $T_0$ to $T_1-1$ are enabled in addition to the units 0 to $T_0-1$), as shown in a solid line box area in the diagram. Corresponding modules are enabled according to different operating modes, so that unnecessary power consumption overheads can be avoided and power consumption can be reduced.

Each eigenvalue is calculated in an iterative manner. In an example of P parallel, P symbols are received in each clock cycle, and an initial value of a register is 0. Calculation of $r_{N-1} \cdot x^{P-1} + r_{N-2} \cdot x^{P-2} + \ldots + r_{N-P+1} \cdot x^1 + r_{N-P} \cdot x^0|_{x=\alpha^i}$ is completed in a first clock cycle to obtain a value, and the value is stored in the register; calculation of $$(r_{N-1} \cdot x^{P-1} + r_{N-2} \cdot x^{P-2} + \ldots + r_{N-P+1} \cdot x^1 + r_{N-P} \cdot x^0)x^P + \\ (r_{N-P-1} \cdot x^{P-1} + r_{N-P-2} \cdot x^{P-2} + \ldots + r_{N-2P+1} \cdot x^1 + r_{N-2P} \cdot x^0)|_{x=\alpha^i}$$

is completed in a second clock cycle to obtain a value, and the value is stored in the register; and by analogy, a value to be stored in the register is obtained after calculation of $(r_{N-1} \cdot x^{N-1} + r_{N-2} \cdot x^{N-2} + \ldots + r_1 \cdot x^1 + r_0 \cdot x^0|_{x=\alpha^i}$ is completed in an $(N/P)^{th}$ clock cycle.

When operating in the RS $(N_0, K)$ mode, the multimode RS FEC decoder finally obtains $T_0$ solved eigenvalues. When operating in the RS $(N_1, K)$ mode, the multimode RS FEC decoder finally obtains $T_1$ solved eigenvalues. It should be noted that, for solving of an eigenvalue $S_i$, where $0 \le i \le T_0-1$, an only difference is that when the multimode RS FEC decoder operates in two operating modes RS $(N_0, K)$ and RS $(N_1, K)$, iteration cycles are different and are respectively $N_0/P$ and $N_1/P$, and complete multiplexing may be implemented by eigenvalue calculation subunits 0 to $T_0-1$. One control subunit (that is, a first control subunit of the multimode RS FEC decoder) may be used to control an enabled state of the eigenvalue calculation subunit.

After completing calculation of an eigenvalue, an eigenvalue calculation subunit sends the eigenvalue obtained by calculation to a key equation solving unit (KES) to calculate an error location polynomial $\Lambda(x)$ and an error value polynomial $\Omega(x)$. A relationship between the two polynomials is expressed by a characteristic equation shown in a formula (13):

$$\Lambda(x) \cdot S(x) = \Omega(x) \bmod x^{2T} \qquad \text{formula (13)}.$$

For solving of the characteristic equation shown in the formula (13), an RiBM algorithm and the like may be used.

Figure 7:
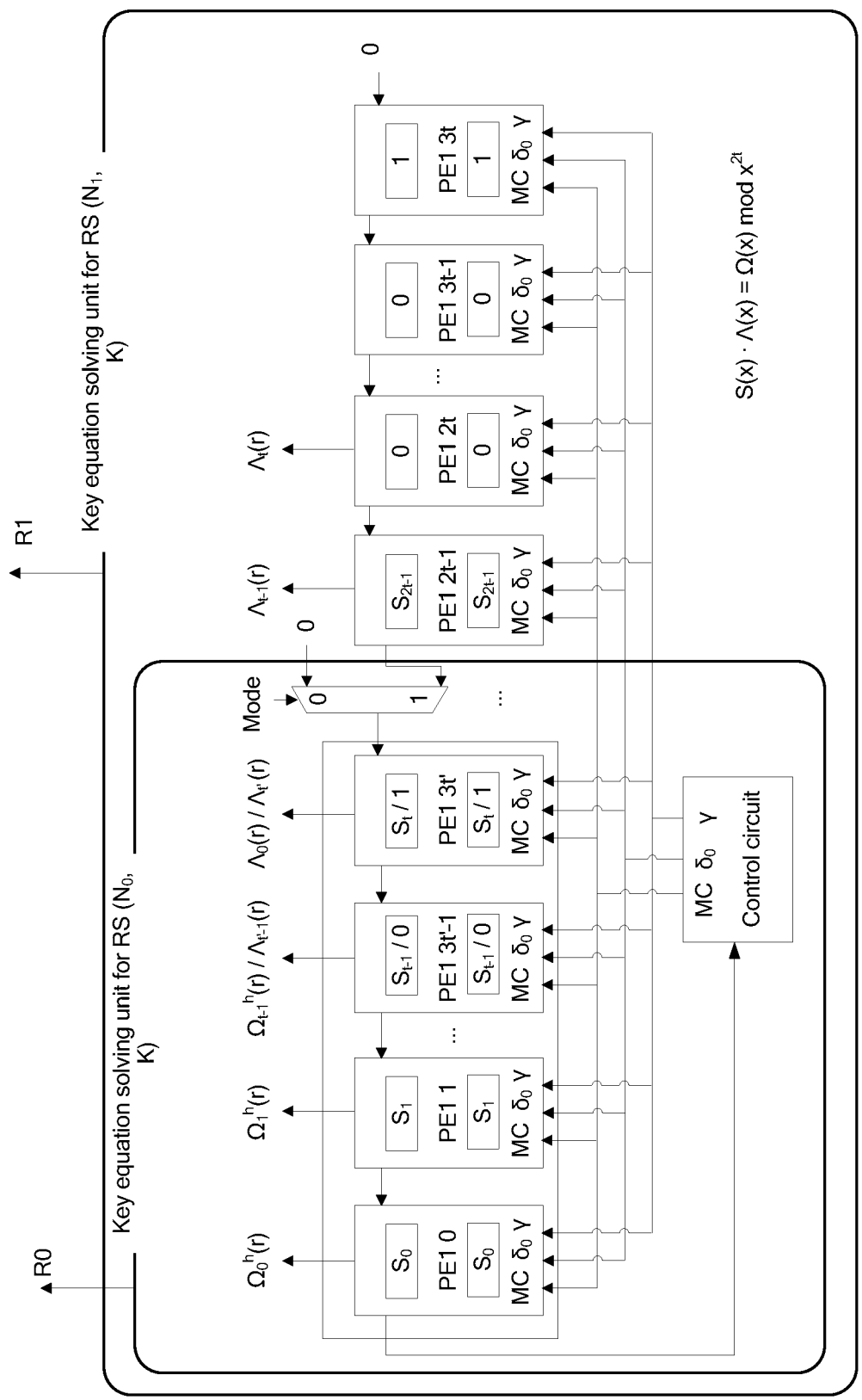
FIG. 7 is a schematic circuit diagram of key equation solving by a multimode RS FEC decoder according to an embodiment of the present invention.

FIG. 7 is a schematic circuit diagram of key equation solving by a multimode RS FEC decoder according to an embodiment of the present invention. In FIG. 7, a PE 1 is a processing engine (that is, a key equation solving subunit of the multimode RS FEC decoder) of a key equation solving unit. It can be learned from FIG. 7 that, for decoding in an RS $(N_0, K)$ operating mode, PEs 1 0 to $3T_0$ need to be enabled, and PEs 1 $3T_0$ to $3T_1$ may be disabled, so as to reduce power consumption. For decoding in an RS $(N_1, K)$ operating mode, the PEs 1 $3T_0$ to $3T_1$ need to be enabled.

Figure 8:
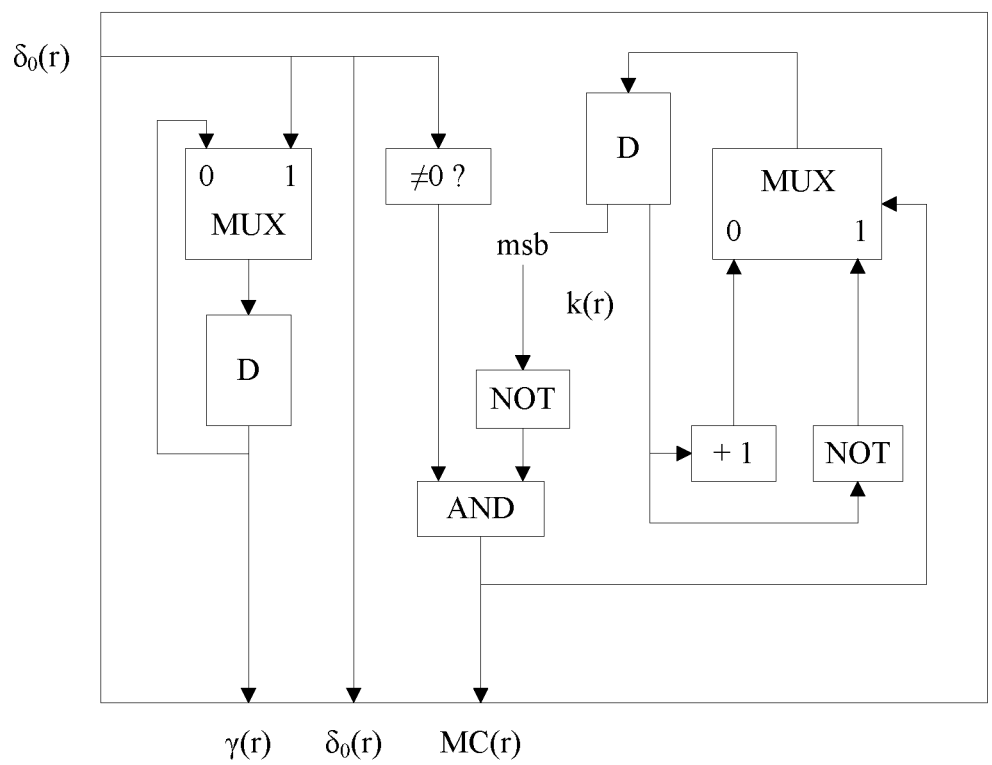
FIG. 8 is a schematic circuit diagram of a control circuit shown in FIG. 7.

FIG. 8 is a schematic circuit diagram of a control circuit shown in FIG. 7, and the control circuit is configured to implement an RiBM iteration algorithm.

For ease of understanding, the following provides description of a pseudo code in the RiBM algorithm.

Initialization:

$\delta_{3t+1}(r)=0$ $\delta_{3t}(0)=\theta_{3t}(0)=1$ $\delta_i(0)=\theta_i(0)=0, i=2t, 2t+1, \ldots, 3t-1$ $k(0)=0, \gamma(0)=1$ Input:

$\delta_i(0)=\theta_i(0)=S_i, i=0,1, \ldots, 2t-1$ for r=0 step 1 until 2t−1 do
begin
step1, $\delta_i(r+1)=\gamma(r) \times \delta_{i+1}(r) - \delta_0(r) \times \theta_i(r), i=0,1,2, \ldots, 3t$ step2, if($\delta_0(r) \ne 0$ and $k(r) \ge 0$)

$\theta_i(r+1)=\delta_{i+1}(r), i=0,1,2, \ldots, 3t$ $\gamma(r+1)=\delta_0(r)$ $k(r+1)=k(r)-1;$ else $\theta_i(r+1)=\theta_i(r), i=0,1,2, \ldots, 3t$ $\gamma(r+1)=\gamma(r)$ $k(r+1)=k(r)+1;$ end
Output:

$\Omega_i^h(2t)=\delta_i(2t), i=0,1, \ldots, t-1$ $\Lambda_i(2t)=\delta_{i+t}(2t), i=0,1, \ldots, t.$ An error location polynomial $\Lambda(x)$ and an error value polynomial $\Omega(x)$ may be obtained by calculation by a key equation solving unit. The error location polynomial $\Lambda(x)$ is sent to a Chien search unit to solve an error location, and the Chien search unit further calculates an intermediate result xΛ'(x) xΛ'(x) and the error value polynomial Ω(x) are sent to an error value calculation unit (Forney) to calculate a value of the error location.

Figure 9A:
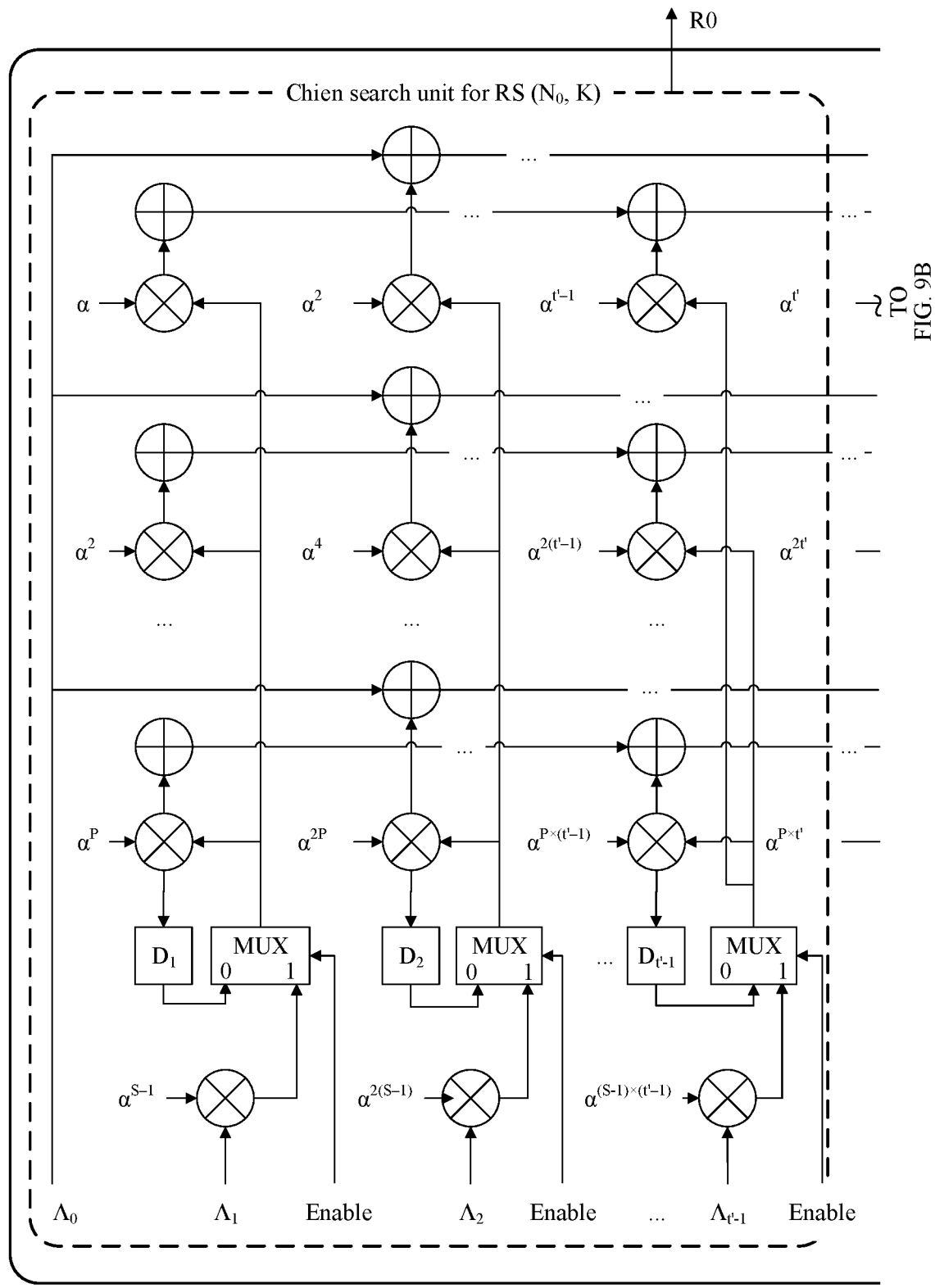
FIG. 9A and FIG. 9B are a schematic circuit diagram of a Chien search unit of a multimode RS FEC decoder according to an embodiment of the present invention.
Figure 9B:
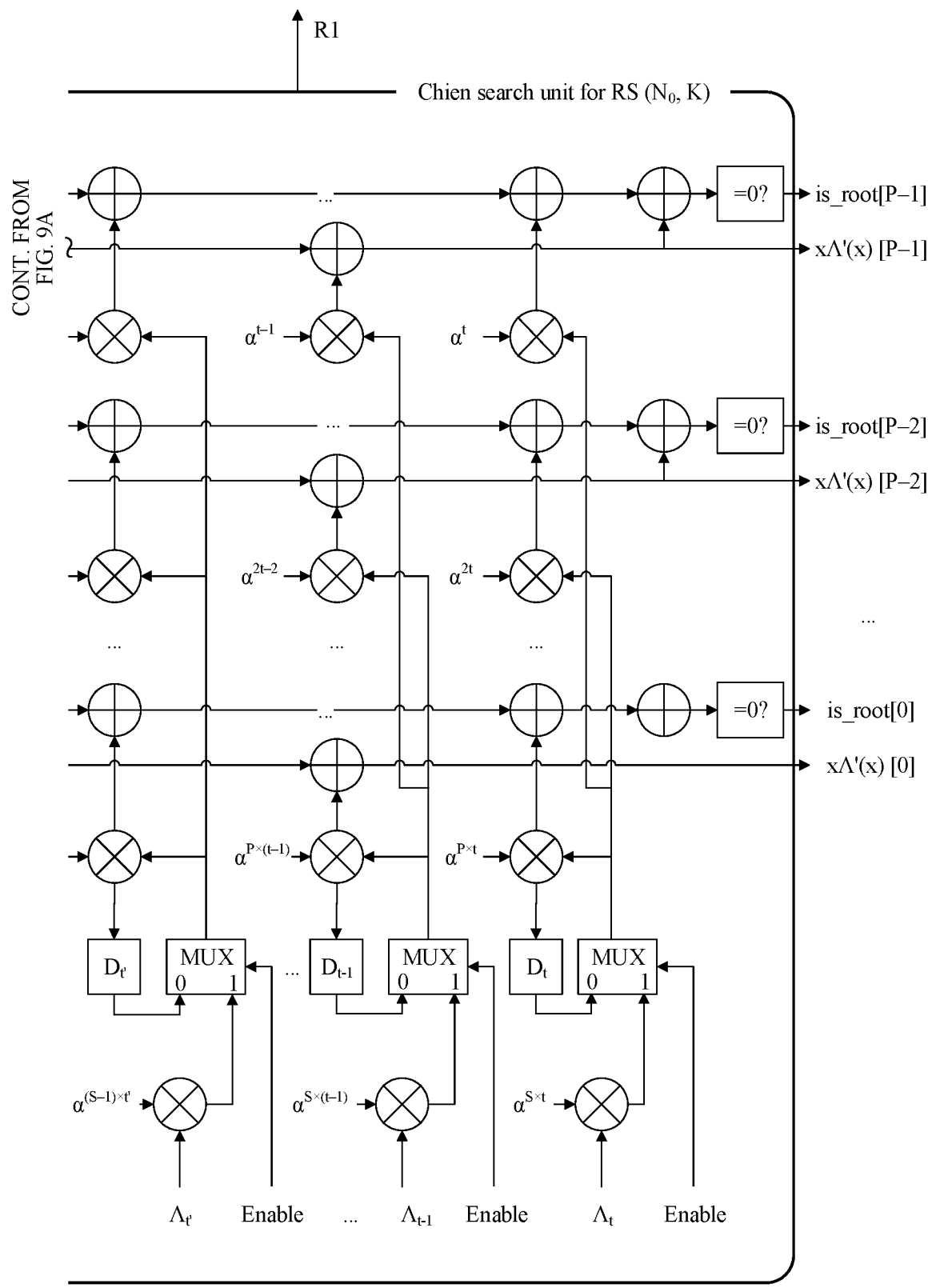

FIG. 9A and FIG. 9B are a schematic circuit diagram of a Chien search unit of a multimode RS FEC decoder according to an embodiment of the present invention. An R0 area shows a schematic circuit diagram of a Chien search unit in an RS ($N_0$, K) operating mode, and an $R_1$ area shows a schematic circuit diagram of a Chien search unit in an RS ($N_1$, K) operating mode. A difference between the Chien search (CS) circuit in the RS ($N_0$, K) operating mode and the Chien search circuit (CS) in the RS ($N_1$, K) operating mode is that, an error location polynomial of the Chien search circuit in the RS ($N_0$, K) operating mode is of $T_0=(N_0-K)/2$ orders, and an error location polynomial of the Chien search circuit (CS) in the RS ($N_1$, K) operating mode is of $T_1=(N_1-K)/2$ orders. A function implemented by the Chien search unit is searching for a valid root of an error location polynomial Λ(x), and the error location polynomial Λ(x) output by a key equation solving unit is an input parameter of the Chien search unit. When a value of Λ(x) is 0, a value of x is the valid root of Λ(x):

$$\Lambda(x)=\Lambda_T x^T+\Lambda_{T-1}x^{T-1}+\ldots+\Lambda_1 x^1+\Lambda_0.$$

For the RS ($N_0$, K) operating mode, $T=T_0$, and for the RS ($N_1$, K) operating mode, $T=T_1$. For an RS (N, K) operating mode, a start location and an end location of a valid root that are solved by the Chien search unit are $2^M-N$ and $2^M-1$, and M is a quantity of bits of each symbol.

xΛ'(x) is solved by using the following equation:

$$\begin{aligned}x\Lambda'(x) &= x(\Lambda_T x^T + \Lambda_{T-1}x^{T-1} + \ldots + \Lambda_1 x^1 + \Lambda_0)' \\ &= T\Lambda_T x^T + (T-1)\Lambda_{T-1}x^{T-1} + \ldots + \Lambda_1 x^1 \\ &= \Lambda_1 x^1 + \Lambda_3 x^3 + \ldots + \Lambda_{2J-1}x^{2J-1}, T-1 \le 2J-1 \le T\end{aligned}$$

An addition feature $2a=a+a=0$ of a finite field is used in the foregoing equation. That is, xΛ'(x) is a sum of odd terms in Λ(x)

In P parallel, a specific operating procedure of the Chien search unit is as follows: for an RS (N, K) code word, a start location for searching is $2^M-N$, and whether $\alpha^{2^M-N}$ is the valid root of the polynomial Λ(x) is verified. It can be learned from FIG. 9A and FIG. 9B that, a first row to a $p^{th}$ row of circuits of the Chien search unit calculate values of $\Lambda(\alpha^{2^M-N})$, $\Lambda(\alpha^{2^M-N+1})$, . . . , and $\Lambda(\alpha^{2^M-N+P-1})$, that is, verify whether to $\alpha^{2^M-N}$ to $\alpha^{2^M-N+P-1}$ are valid roots of Λ(x). It can be learned from the $p^{th}$ row in FIG. 9A and FIG. 9B that, when calculation is completed in a first clock cycle, $\alpha^P \Lambda(\alpha^{2^M-N-1})$, $\alpha^{2P}\Lambda(\alpha^{2^M-N-1})$, . . . , and $\alpha^{T \cdot P}\Lambda(\alpha^{2^M-N-1})$ are stored in a register of each corresponding column. When a second clock cycle starts, a multiplexer (MUX) in the $p^{th}$ row points to content stored in the register. In this case, the first row to the $p^{th}$ row of circuits calculate values of $\Lambda(\alpha^{2^M-N+P})$, $\Lambda(\alpha^{2^M-N+P+1})$, . . . , and $\Lambda(\alpha^{2^M-N+P-1})$, that is, verify whether $\alpha^{2^M-N+P}$ to $\alpha^{2^M-N+P-1}$ are valid roots of Λ(x). In addition, $\alpha^P \Lambda(\alpha^{2^M-N+P-1})$, $\alpha^{2P}\Lambda(\alpha^{2^M-N+P-1})$, . . . , and $\alpha^{T \cdot P}\Lambda(\alpha^{2^M-N+P-1})$ are stored in a register of each corresponding column. By analogy, after N/P clock cycles, the Chien search unit exhausts all N possible error locations.

When searching for a valid root of an error location polynomial, the Chien search unit sends a found result to a downstream error value calculation unit (Forney unit). Values provided by the Chien search unit include: a value indicating whether corresponding P locations in a current clock cycle are valid roots, and error values corresponding to the P locations. If a location is not a valid root, an error value corresponding the location is 0, or if a location is a valid root, an error value corresponding to the location is xΛ'(x).

Figure 10:
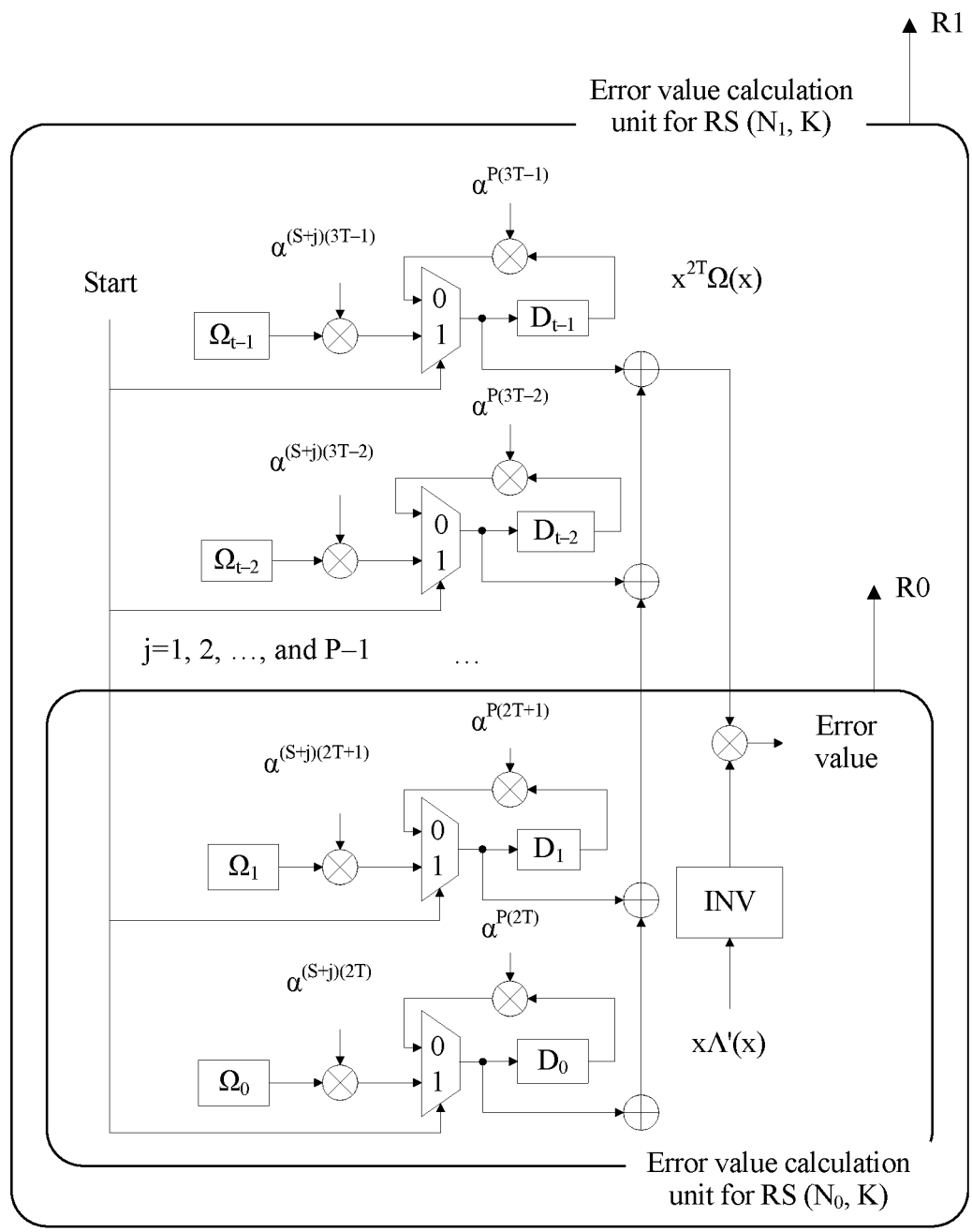
FIG. 10 is a schematic circuit diagram of an error value calculation unit of a multimode RS FEC decoder according to an embodiment of the present invention.

FIG. 10 is a schematic circuit diagram of an error value calculation unit of a multimode RS FEC decoder according to an embodiment of the present invention. An R0 area shows a schematic circuit diagram of an error value calculation unit in an RS ($N_0$, K) operating mode, and an $R_1$ area shows a schematic circuit diagram of an error value calculation unit in an RS ($N_1$, K) operating mode. Input parameters of the error value calculation unit include a value xΛ'(x) output by a Chien search unit, and an error value polynomial Ω(x) output by a key equation solving unit.

When obtaining xΛ'(x) provided by the Chien search unit and the error value polynomial Ω(x) provided by the key equation solving unit (KES), the error value calculation unit may calculate a value of an error location according to a formula (14):

$$\frac{x^{2T}\Omega(x)}{x\Lambda'(x)}. \qquad \text{formula (14)}$$

It should be noted that, for an RS ($N_0$, K) operating mode and an RS ($N_1$, K) operating mode, a difference between error value calculation formulas for the RS ($N_0$, K) operating mode and the RS ($N_i$, K) operating mode is that orders of Ω(x) are different, and therefore, for decoding in the RS ($N_0$, K) operating mode, D_0 to D_($T_0$-1) in FIG. 10 need to be enabled, and for decoding in the RS ($N_1$, K) operating mode, D_($T_0$-1) to D_($T_1$-1) need to be further enabled. It should be additionally noted that, for different code lengths N, the error value calculation unit starts to perform calculation at different start points S, where $S=2^{(M-N)}$. Therefore, in a first clock cycle in which the error value calculation unit starts to perform calculation, multiplier coefficients related to Ω(x) are different. In this case, a multiplier of a constant coefficient cannot be shared. In comparison with a logic resource increase caused because an entire decoding circuit cannot be shared, influence of a circuit of the multiplier of the constant coefficient can be ignored.

After the error value calculation unit completes calculation of an error value, an error correction unit may perform error correction on a current FEC frame according to an error correction value that is calculated by the error value calculation unit and that is corresponding to an error location of the current FEC frame, and the current FEC frame cached by a frame buffer unit.

In addition, the multimode RS FEC decoder may further perform decoding according to a code pattern, collect statistics about a bit error rate BERin input by the FEC decoder, and compare BERin obtained by statistics collection with a preset upper threshold and a preset lower threshold of the bit error rate. If BERin exceeds the upper threshold, the multimode RS FEC decoder determines to choose an RS FEC code pattern with higher performance, for example, RS ($N_{i+1}$, K); or if BERin is less than the lower threshold, the multimode RS FEC decoder determines to choose an RS FEC code pattern with lower performance, for example, RS ($N_{i-1}$, K); or if BERin ranges from the upper threshold to the lower threshold, the multimode RS FEC decoder determines to keep the RS FEC code pattern unchanged. The multimode RS FEC decoder may transmit code pattern decision-making information of the decoder to a multimode RS FEC encoder on an encoder side by using a reverse link.

Accordingly, the multimode RS FEC encoder on the encoder side may adjust, according to a code pattern that is fed back by the multimode RS FEC decoder on the decoder side, a code pattern for encoding, and then perform encoding and sending.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A multimode Reed-Solomon forward error correction (RS FEC) encoder, wherein the multimode RS FEC encoder has a total of (L+1) RS ($N_i$, K) operating modes, i=0, 1, . . . , and L, wherein L is an integer greater than 0, and wherein $N_i$ represents a length of an RS FEC code word in a corresponding operating mode, and wherein $N_i=N_0+i\times P$, wherein $N_0$ represents a shortest length of an RS FEC code word in the multimode RS FEC encoder, wherein P is a positive integer, and wherein K represents a quantity of information symbols in the RS FEC code word, wherein the multimode RS FEC encoder comprises a control circuit, an initial encoding circuit, and L incremental encoding units circuits, wherein:

the control circuit is configured to control the initial encoding circuit and the L incremental encoding circuits to be enabled when the multimode RS FEC encoder performs encoding, wherein the control circuit is configured to enable only the initial encoding circuit in an RS ($N_0$, K) operating mode to perform encoding or enable only the initial encoding circuit and first j incremental encoding circuits in the L incremental encoding circuits in an RS ($N_j$, K) operating mode to perform encoding, wherein j is an integer, and wherein $1 \le j \le L$;

the initial encoding circuit is configured to perform RS FEC encoding on an information polynomial m(x) corresponding to an information symbol of the multimode RS FEC encoder to obtain a quotient $D_0(x)$ and a remainder $R_0(x)$ of a polynomial $x^{N_0-K}m(x)$ relative to $g_0(x)$, wherein $g_0(x)$ is a generator polynomial in the RS ($N_0$, K) operating mode; and an $(h+1)^{th}$ incremental encoding circuit in the L incremental encoding circuits is configured to obtain, according to a quotient $D_h(x)$ and a remainder $R_h(x)$, a quotient $D_{h+1}(x)$ and a remainder $R_{h+1}(x)$ of a polynomial $x^{N_{h+1}-K}m(x)$ relative to $g_{h+1}(x)$, wherein $g_{h+1}(x)$ is a generator polynomial in an RS ($N_{h+1}$, K) operating mode, wherein h is an integer, and wherein $0 \le h \le L-1$.

2. The encoder according to claim 1, wherein a relationship between $D_{h+1}(x)$ and $R_{h+1}(x)$ and a relationship between $D_h(x)$ and $R_h(x)$ are expressed by the following formulas:

$$R_{h+1}(x)=r_{h+1}(x)\times g_h(x)+x^P R_h(x); \text{ and}$$

$$D_{h+1}(x)=d_{h+1}(x),$$

wherein $d_{h+1}(x)$ represents a quotient of $x^P D_h(x)$ relative to a generator polynomial $g_{h,h+1}(x)$, wherein $r_{h+1}(x)$ represents a remainder of $x^P D_h(x)$ relative to the generator polynomial $g_{h,h+1}(x)$, and wherein a relationship among generator polynomials $g_{h,h+1}(x)$, $g_h(x)$, and $g_{h+1}(x)$ is expressed by a formula $g_{h+1}(x)=g_h(x)\times g_{h,h+1}(x)$.

3. The encoder according to claim 1, wherein
a value of L is 3, a value of P is 8, a value of $N_0$ is 520, and a value of K is 514; or
a value of L is 1, a value of P is 16, a value of $N_0$ is 528, and a value of K is 514.

4. The encoder according to claim 1, further comprising:
a fill-in circuit, the fill-in circuit configured to, when the multimode RS FEC encoder is in the RS ($N_j$, K) operating mode, fill a code word whose length is $N_j$ with a fixed sequence until the length reaches $N_L$, wherein j<L.

5. The encoder according to claim 1, wherein the multimode RS FEC encoder further comprises a code pattern selection circuit, the code pattern selection circuit configured to:
select, as a code pattern used for encoding, a code pattern fed back by a multimode RS FEC decoder on a decoder side, the selection causing the multimode RS FEC encoder to perform encoding according to the fed-back code pattern; and
send a result of the encoding to the multimode RS FEC decoder.

6. A multimode Reed-Solomon forward error correction (RS FEC) decoder, wherein the multimode RS FEC decoder has a total of (L+1) RS ($N_i$, K) operating modes, i=0, 1, ..., and L, wherein L is an integer greater than 0, and wherein $N_i$ represents a length of an RS FEC code word in a corresponding operating mode, and wherein $N_i=N_0+i \times P$, $N_0$ represents a shortest length of an RS FEC code word in the multimode RS FEC decoder, wherein P is a positive integer, and wherein K represents a quantity of information symbols in the RS FEC code word, wherein the multimode RS FEC decoder comprises an eigenvalue calculation circuit, a key equation solving circuit, a Chien search circuit, an error value calculation circuit, an error correction circuit, and a frame buffer circuit, and wherein the eigenvalue calculation circuit comprises $N_L-K$ eigenvalue calculation sub-circuits and a first control sub-circuit, and wherein the key equation solving circuit comprises $3(N_L-K)/2+1$ key equation solving sub-circuits and a second control sub-circuit; and
when the multimode RS FEC decoder performs decoding in the RS ($N_i$, K) operating mode:
the eigenvalue calculation circuit is configured to calculate $N_i-K$ eigenvalues according to $N_i$ code words of a received current FEC frame, wherein calculation of each eigenvalue is completed by a respective eigenvalue calculation sub-circuit, and wherein the first control sub-circuit controls first $N_i-K$ eigenvalue calculation sub-circuits in the $N_L-K$ eigenvalue calculation sub-circuit to be enabled to calculate the $N_i-K$ eigenvalues;
the key equation solving circuit is configured to receive the $N_i-K$ eigenvalues and calculate an error location polynomial and an error value polynomial according to the $N_i-K$ eigenvalues; and
the second control sub-circuit is configured to:
control first $3(N_i-K)/2+1$ key equation solution sub-units in the $3(N_L-K)/2+1$ key equation solving sub-circuit to be enabled to calculate an error location polynomial $\Lambda(x)$ and an error value polynomial $\Omega(x)$;
send the error location polynomial $\Lambda(x)$ to the Chien search circuit, and
send the error value polynomial $\Omega(x)$ to the error value calculation circuit;
the Chien search circuit is configured to determine an error location of the current FEC frame by exhausting a root of the error location polynomial $\Lambda(x)$, and send a polynomial $x\Lambda'(x)$ to the error value calculation circuit, wherein the polynomial $x\Lambda'(x)$ represents a sum of odd terms in $\Lambda(x)$;
the error value calculation circuit is configured to calculate, according to the error value polynomial $\Omega(x)$ and the sum $x\Lambda'(x)$ of the odd terms in the error location polynomial $\Lambda(x)$, an error correction value corresponding to the error location of the current FEC frame;
the frame buffer circuit is configured to cache the current FEC frame until the error value calculation circuit obtains, by calculation, the error correction value corresponding to the error location of the current FEC frame; and
the error correction circuit is configured to perform error correction on the current FEC frame according to the error correction value corresponding to the error location of the current FEC frame and the current FEC frame cached by the frame buffer circuit.

7. The multimode RS FEC decoder according to claim 6, wherein the multimode RS FEC decoder further comprises a statistics collecting circuit and a code pattern feedback circuit, wherein:
the statistics collecting circuit is configured to collect statistics about a bit error rate obtained when transmission is performed in the RS ($N_i$, K) operating mode; and
the code pattern feedback circuit is configured to:
when the bit error rate is greater than a preset upper threshold, select an RS ($N_{i+1}$, K) code pattern, and feed back the RS ($N_{i+1}$, K) code pattern to a multimode RS FEC encoder on an encoder side; or
when the bit error rate is less than a preset lower threshold, select an RS ($N_{i-1}$, K) code pattern, and feed back the RS ($N_{i-1}$, K) code pattern to a multimode RS FEC encoder on an encoder side.

8. The multimode RS FEC decoder according to claim 6, wherein the multimode RS FEC decoder further comprises a de-fill circuit, configured to: when the multimode RS FEC decoder operates in the RS ($N_i$, K) operating mode and i≤L, intercept a code word whose length is $N_i$ from a code word whose length is $N_L$ to perform decoding.

* * * * *

UNITED STATES PATENT AND TRADEMARK OFFICE
CERTIFICATE OF CORRECTION

PATENT NO. : 10,826,534 B2
APPLICATION NO. : 16/046618
DATED : November 3, 2020
INVENTOR(S) : Yuchun Lu et al.

Page 1 of 1

It is certified that error appears in the above-identified patent and that said Letters Patent is hereby corrected as shown below:

In the Claims

In Column 18, Line 22, in Claim 1, after "encoding" delete "units".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*